United States Patent
Sung

(10) Patent No.: US 12,532,701 B2
(45) Date of Patent: Jan. 20, 2026

(54) CORRECTION DEVICE FOR WAFERS AND ROTATIONAL DRIVE MECHANISM OF THE WAFERS AND CORRECTION METHOD THEREOF

(71) Applicant: Mao-Yen Sung, Zhubei (TW)

(72) Inventor: Mao-Yen Sung, Zhubei (TW)

( * ) Notice: Subject to any disclaimer, the term of this patent is extended or adjusted under 35 U.S.C. 154(b) by 783 days.

(21) Appl. No.: 17/759,942

(22) PCT Filed: Feb. 9, 2021

(86) PCT No.: PCT/CN2021/076316
§ 371 (c)(1),
(2) Date: Aug. 2, 2022

(87) PCT Pub. No.: WO2021/164667
PCT Pub. Date: Aug. 26, 2021

(65) Prior Publication Data
US 2023/0064861 A1   Mar. 2, 2023

(30) Foreign Application Priority Data

Feb. 19, 2020 (CN) .......................... 202010102259.2
Feb. 19, 2020 (CN) .......................... 202020184839.6

(51) Int. Cl.
*H01L 21/67* (2006.01)
*G06T 7/00* (2017.01)
*H01L 21/687* (2006.01)

(52) U.S. Cl.
CPC ...... *H01L 21/67259* (2013.01); *G06T 7/0004* (2013.01); *H01L 21/68707* (2013.01); *G06T 2207/30148* (2013.01)

(58) Field of Classification Search
CPC ......... H01L 21/67259; H01L 21/68707; H01L 21/67766; H01L 21/681; G06T 7/004
See application file for complete search history.

(56) References Cited

U.S. PATENT DOCUMENTS 4,980,971 A * 1/1991 Bartschat .............. H01L 21/681
                                                                   414/730
6,323,616 B1 * 11/2001 Sagues ................... B25J 9/1692
                                                                   318/568.15

(Continued)

*Primary Examiner* — Patrick H Mackey
(74) *Attorney, Agent, or Firm* — Rosenberg, Klein & Lee

(57) ABSTRACT

A correction device for wafers and rotational drive mechanism of the wafers and a correction method thereof. The correction device includes a first robotic arm, an image capturing assembly and a wafer locating member installation/uninstallation mechanism disposed on the first robotic arm. The correction device further includes a second robotic arm and a wafer taking/placing mechanism disposed on the second robotic arm. The first robotic arm drives the image capturing assembly and the wafer locating member installation/uninstallation mechanism to move to a main correction mechanism to correct the image capturing range and the operation position thereof. The second robotic arm drives the wafer taking/placing mechanism to move to the main correction mechanism to correct the operation position thereof. The wafer taking/placing mechanism moves the wafer to a wafer correction mechanism to read the data of the wafer and adjust the wafer to a true angular position.

11 Claims, 25 Drawing Sheets

(56) References Cited

U.S. PATENT DOCUMENTS

| | | | |
|---|---|---|---|
| 9,002,514 B2* | 4/2015 | Genetti | H01L 21/67742 |
| | | | 901/14 |
| 9,442,482 B2* | 9/2016 | Miner | H01L 21/67259 |
| 11,929,273 B2* | 3/2024 | Kuo | H01L 21/6773 |
| 2020/0043812 A1* | 2/2020 | Lin | H05K 13/08 |

* cited by examiner

CORRECTION DEVICE FOR WAFERS AND ROTATIONAL DRIVE MECHANISM OF THE WAFERS AND CORRECTION METHOD THEREOF

BACKGROUND OF THE INVENTION

1. Field of the Invention

The present invention relates generally to a correction device for wafers and rotational drive mechanism of the wafers and a correction method thereof, and more particularly to a correction device and a correction method, which employs simple mechanisms and operations to respectively correct different robotic arms to set up a common reference point and keep precise moving precision as well as adjust the wafer to a true angular position.

2. Description of the Related Art

In general, the manufacturing process of integrated circuit (IC) includes two major parts: manufacturing of silicon wafer, manufacturing of integrated circuit and packaging of integrated circuit. After the silicon ingot is cut into wafers, the wafer must experience multiple complicated procedures of lithography, crystal growth, etching, mechanical grinding, etc. to complete the manufacturing of the integrated circuit. In the above manufacturing process, when the wafer goes through the procedures of test, washing, evaporation, drying and organic solvent soaking, in order to effectively secure the wafer for easy processing, the respective wafers must be first secured onto a wafer disc. Then the respective wafer discs bear and carry the respective wafers to perform the aforesaid processing operations.

The basic structure of a common wafer disc is a disc body with a configuration identical to the wafer and a bearing area slightly larger than the outer diameter of the wafer. An annular frame body is detachably disposed on the disc body. The disc body and the annular frame body define therebetween a position for receiving the wafer. In addition, multiple latch mechanisms are arranged along the circumference of the disc body for securely holding the annular frame body and pressing the annular frame body against the circumference of the wafer to locate the wafer. In practice, in order to mass-process the wafers at the same time, generally multiple wafer discs are disposed on a large-area carrier disc. The carrier disc can receive multiple wafer discs and move the wafer discs at the same time for different processing procedures. Accordingly, the wafer processing efficiency can be effectively enhanced as a whole.

With the gradual popularization of automatic mechanical processing, robotic arms are used to perform the taking/placing operation of the wafers on the wafer disc. This not only greatly saves labor, but also lowers the production cost and enhances the processing efficiency. There is a trend to utilize the automatic machines to perform the taking/placing operation of the wafers. However, the wafer itself is extremely fragile and requires very high processing precision. Therefore, the wafer taking/placing operation precision of one single robotic arm is extremely highly required. Also, when multiple robotic arms are used to respectively perform different operations to the same wafer, the multiple robotic arms must have the same precision. Otherwise, the processing precision and the product quality are very easy to affect. In some serious cases, the products are even damaged. Therefore, it is critical how to effectively correct the respective robotic arms so as to make one single robotic arm keep excellent precision in different processing operations as well as correct different robotic arms with reference to common reference point, whereby the different robotic arms are excellently relatively movably connected with each other. This can ensure that the respective robotic arms have excellent operational precision of the respective robotic arms when performing different operations to the wafer.

Moreover, in procedures of test, washing, drying and organic solvent soaking of the wafers, it is necessary to repeatedly transfer the wafers and take/place the wafers in the processing position. In order to effectively distinguish and control the wafer products manufactured in different batches, generally the wafers are respectively encoded with a bar code, whereby an automatic apparatus (a camera or a code reader) can quickly read and record the code data of the wafers. Also, with respect to mass-transfer of wafers, conventionally a wafer cartridge is generally used to receive the wafers. In the transfer process of the wafers, the wafers received in the wafer cartridge are apt to deflect from the storing direction (angle) due to shake or shock. Therefore, before using the robotic arms to move the wafers into the position to be processed, it is necessary to first correct the angular position, (that is, the direction), of the wafers, whereby the respective wafers can be precisely placed in the position to be processed for successive processing operations.

However, with respect to the above operation requirement, conventionally two independent devices are generally used to respective correct the direction of the correction mark (such as a notch) of the wafers and read the bar codes of the wafers. In this case, not only the investment cost for the devices is increased, but also the total volume is enlarged. This fails to meet the requirement of economic benefit. Therefore, it is necessary to integrate the bar code data reader and wafer direction correction device into one single device so as to improve the conventional device and simplify the structure as well as reduce the total volume.

It is therefore tried by the applicant to provide a correction device for wafers and rotational drive mechanism of the wafers and a correction method thereof to overcome the above limitation in taking/placing the wafers in the respective wafer discs on the carrier disc and meet the above requirement for adjusting the direction of the wafers.

SUMMARY OF THE INVENTION

It is therefore a primary object of the present invention to provide a correction device for wafers and rotational drive mechanism of the wafers and a correction method thereof. A main correction mechanism and a wafer correction mechanism are respectively disposed within the moving range of a first robotic arm and a second robotic arm. An image capturing assembly and a wafer locating member installation/uninstallation mechanism are respectively disposed on the first robotic arm. A wafer taking/placing mechanism is disposed on the second robotic arm. The first robotic arm serves to respectively drive the image capturing assembly and the wafer locating member installation/uninstallation mechanism to move to the main correction mechanism for correcting the image capturing range and the precision of operation position and storing the relative position coordinate between the wafer locating member installation/uninstallation mechanism and the image capturing assembly. The second robotic arm serves to drive the wafer taking/placing mechanism to move to the main correction mechanism for correcting the operation position. The wafer taking/placing mechanism then moves the wafer to the wafer correction mechanism for obtaining the code data of the wafer and adjusting the direction of the wafer into true angular position and direction so that the wafer can be easily moved to a predetermined position for successive processing.

It is a further object of the present invention to provide the above correction device for wafers and rotational drive mechanism of the wafers and the correction method thereof. The image capturing assembly has an upper image capturing component. The wafer locating member installation/uninstallation mechanism has a locating scale. The wafer taking/placing mechanism has an indication scale. The main correction mechanism has a lower image capturing component. A transparent sheet with standard scale is disposed above the lower image capturing component. The first robotic arm drives the image capturing assembly to make the upper and lower image capturing components respectively correspond to the standard scale and obtain the image thereof so as to correct the image capturing range of the image capturing assembly and set up a reference point coordinate of the first robotic arm. The lower image capturing component through the transparent sheet observes the locating scale and obtains the position image of the locating scale so as to correct the operation position of the wafer locating member installation/uninstallation mechanism and calculate the relative coordinate between the image capturing assembly and the wafer locating member installation/uninstallation mechanism. The second robotic arm drives the wafer taking/placing mechanism to make the lower image capturing component through the transparent sheet observe the indication scale and obtain the position image of the indication scale for correcting the operation position of the wafer taking/placing mechanism and set up a reference point coordinate of the second robotic arm. Therefore, the image capturing assembly is first located in a true position on a section to be operated. Then the wafer locating member installation/uninstallation mechanism can directly quickly move to the true position for performing successive operations. Accordingly, not only the operation process is simplified, but also the operation precision between the different mechanisms on one single robotic arm can be maintained. The first and second robotic arms are both corrected through the main correction mechanism so that they have the same reference point coordinate. Therefore, a precise connection relationship between the first and second robotic arms can be set up.

It is still a further object of the present invention to provide the above correction device for wafers and rotational drive mechanism of the wafers and the correction method thereof. The wafer correction mechanism has a rest seat for placing wafers thereon. The center of the rest seat is formed with a through hole. An image capturing unit is disposed above the rest seat. A sucker is disposed under the rest seat corresponding to the through hole. The sucker is drivable by a rotational drive mechanism to suck the wafer through the through hole and drive the wafer to ascend/descend and pivotally rotate in cooperation with the image capturing unit to complete the operations of reading of wafer bar code, checking of circumference of the wafer and correction and adjustment of the correction mark of the wafer. The functions of reading of wafer bar code, checking of circumference of the wafer and correction and adjustment of the correction mark of the wafer are integrated in one single assembly structure. This not only simplifies the entire structure, but also reduces the space occupied by the mechanisms.

To achieve the above and other objects, the correction device for wafers and rotational drive mechanism of the wafers of the present invention includes: a first robotic arm connected with and drivable by a control module, an image capturing assembly and a wafer locating member installation/uninstallation mechanism being disposed at a movable end of the first robotic arm, the image capturing assembly including an upper image capturing component, the wafer locating member installation/uninstallation mechanism having a locating face, a locating scale being disposed on the locating face; a second robotic arm connected with and drivable by the control module, a wafer taking/placing mechanism being disposed at a movable end of the second robotic arm, an indication scale being disposed on the wafer taking/placing mechanism; and a main correction mechanism positioned within a moving range of the first and second robotic arms, the main correction mechanism being connected with and drivable by the control module, the main correction mechanism having a lower image capturing component, a transparent sheet being disposed above the lower image capturing component, a standard scale being disposed on the transparent sheet as a locating reference.

In the above correction device for wafers and rotational drive mechanism of the wafers, range-finding laser source is disposed beside the lower image capturing component of the main correction mechanism. Multiple laser sources are arranged along a circumference of the locating face of the wafer locating member installation/uninstallation mechanism. The multiple laser sources are respectively disposed at at least three points beside the locating face.

The above correction device for wafers and rotational drive mechanism of the wafers further includes a wafer correction mechanism. The wafer correction mechanism has a rest seat for placing a wafer thereon, an image capturing unit for capturing images, a sucker for sucking a wafer and a rotational drive assembly. The image capturing unit is disposed above the rest seat. The sucker is disposed under the rest seat. The rotational drive assembly is connected under the sucker for driving the sucker to carry the wafer on the rest seat to ascend/descend and pivotally rotate.

In the above correction device for wafers and rotational drive mechanism of the wafers, the rotational drive assembly has a lifting module and a pivotally rotational module. The lifting module includes a lifting power source, a cam drivable by the lifting power source to pivotally rotate and a link. One end of the link is pivotally connected with the cam. The pivotally rotational module has a pivotally rotational power source. The pivotally rotational power source is disposed on a slide seat, which can vertically slide and connected with the other end of the link. A pivotally rotational shaft is disposed on the pivotally rotational power source and connected with the sucker.

In the above correction device for wafers and rotational drive mechanism of the wafers, a center of the rest seat is formed with a through hole. The sucker is disposed in a position corresponding to the through hole. A flange is annularly disposed along the circumference of the rest seat.

In the above correction device for wafers and rotational drive mechanism of the wafers, an inward extending guide slope protrudes from an outer circumference of the flange.

In the above correction device for wafers and rotational drive mechanism of the wafers, a recessed section is formed on a portion of the flange of the rest seat.

In the above correction device for wafers and rotational drive mechanism of the wafers, a support module is disposed on one side of the rest seat. The support module has multiple support legs positioned under the rest seat to support the rest seat. A lower side support is disposed on one side of the support legs. The lifting assembly is securely connected with the lower side support. An upper side support upward extends from another side of the support legs. The image capturing unit is secured to one end of the upper side support distal from the lower side support.

To achieve the above and other objects, the correction method employing the above correction device includes steps of: comparing and finding the difference between the position of the standard scale obtained by the lower image capturing component and the position of the standard scale obtained by the upper image capturing component, the first robotic arm driving the image capturing assembly to move to the upper side of the main correction mechanism, the lower image capturing component directly obtaining the position image of the standard scale on the transparent sheet to form a lower standard position image, the upper image capturing component obtaining the position image of the standard scale on the transparent sheet to form an upper standard position image, the control module comparing the lower standard position image with the upper standard position image to find the difference therebetween; setting up a reference point coordinate of the first robotic arm, the first robotic arm driving the image capturing assembly to move to an image correction position and make the lower standard position image overlap with the upper standard position image so as to correct the image capturing range of the image capturing assembly, the control module storing the coordinate of the image capturing correction position of the image capturing assembly to set up the reference point coordinate of the first robotic arm; comparing and finding the difference between the position of the locating scale and the position of the standard scale obtained by the lower image capturing component, the first robotic arm driving the wafer locating member installation/uninstallation mechanism to move to the upper side of the main correction mechanism, the lower image capturing component through the transparent sheet observing the locating scale on the locating face and obtaining the position image of the locating scale to form a locating position image, the control module comparing the lower standard position image with the locating position image and finding the difference therebetween; setting up true operation position of the wafer locating member installation/uninstallation mechanism, the first robotic arm driving the wafer locating member installation/uninstallation mechanism to move to an installation/uninstallation correction position and make the lower standard position image overlap with the locating position image so as to correct the operation position of the wafer locating member installation/uninstallation mechanism, the control module storing the coordinate of the installation/uninstallation correction position of the wafer locating member installation/uninstallation mechanism and calculating and storing the relative coordinate between the image capturing correction position and the installation/uninstallation correction position; comparing and finding the difference between the position of the indication scale and the position of the standard scale obtained by the lower image capturing component, the second robotic arm driving the wafer taking/placing mechanism to move to the upper side of the main correction mechanism, the lower image capturing component through the transparent sheet observing the indication scale on the wafer taking/placing mechanism and obtaining the position image of the indication scale to form an indication position image, then the control module comparing the lower standard position image with the indication position image and finding the difference therebetween; setting up a reference point coordinate of the second robotic arm, the second robotic arm driving the wafer taking/placing mechanism to move to a taking/placing correction position and make the lower standard position image overlap with the indication position image so as to correct the operation position of the wafer taking/placing mechanism, the control module storing the coordinate of the taking/placing correction position of the wafer taking/placing mechanism to set up a reference point coordinate of the second robotic arm and make the first and second robotic arms have the same reference point coordinate; using the wafer taking/placing mechanism to place the wafer on the rest seat, the second robotic arm driving the wafer taking/placing mechanism to take out a wafer and move the wafer to the upper side of the rest seat of the wafer correction mechanism; making the image capturing unit correspond to a portion of the circumference of the wafer, the projection range of the image capturing unit of the wafer correction mechanism corresponding to the code and the correction mark (could be a notch) position of the wafer to obtain the image data of the code and the correction mark (notch) position of the wafer; using the rotational drive assembly to drive the wafer to rotate by 360 degrees for the image capturing unit to obtain full image of the circumference of the wafer, the rotational drive assembly driving the sucker to suck the wafer and driving the wafer to rotate by one circle, whereby the image capturing unit can obtain the image of the full circumference of the wafer so as to check whether the wafer is complete without damage; and using the rotational drive assembly to drive the wafer to rotate to true angular position, according to the angle needing to be adjusted, the control module driving the rotational drive assembly to drive the wafer to rotate via the sucker, whereby the correction mark (notch) of the wafer is moved to a true angular position, the sucker being separated from the wafer to make the wafer fall back onto the rest seat.

Before the step of comparing and finding the difference between the position of the standard scale obtained by the lower image capturing component and the position of the standard scale obtained by the upper image capturing component, the above correction method further includes a step of adjusting the focal length of the lens of the upper image capturing component corresponding to the standard scale. The range-finding laser source of the main correction mechanism generates and projects the laser beams onto the standard scale of the image capturing assembly so as to measure the distance between the main correction mechanism and the standard scale and adjust the focal length of the lens of the upper image capturing component, whereby the upper image capturing component can easily obtain a clear position image of the standard scale on the transparent sheet.

Before the step of comparing and finding the difference between the position of the locating scale and the position of the standard scale obtained by the lower image capturing component, the above correction method further includes a step of adjusting the focal length of the lens of the lower image capturing component corresponding to the locating scale. The range-finding laser source of the main correction mechanism generates and projects the laser beams onto the locating scale of the locating face so as to measure the distance between the main correction mechanism and the wafer locating member installation/uninstallation mechanism and adjust the focal length of the lens of the lower image capturing component, whereby the lower image capturing component can easily obtain a clear position image of the locating scale of the wafer locating member installation/uninstallation mechanism.

Before the step of comparing and finding the difference between the position of the indication scale and the position of the standard scale obtained by the lower image capturing component, the above correction method further includes a step of adjusting the focal length of the lens of the lower image capturing component corresponding to the indication scale. The range-finding laser source of the main correction mechanism generates and projects the laser beams onto the indication scale of the wafer taking/placing mechanism so as to measure the distance between the main correction mechanism and the indication scale and adjust the focal length of the lens of the lower image capturing component, whereby the lower image capturing component can easily obtain a clear position image of the indication scale of the wafer taking/placing mechanism.

The present invention can be best understood through the following description and accompanying drawings, wherein:

Figure 15:
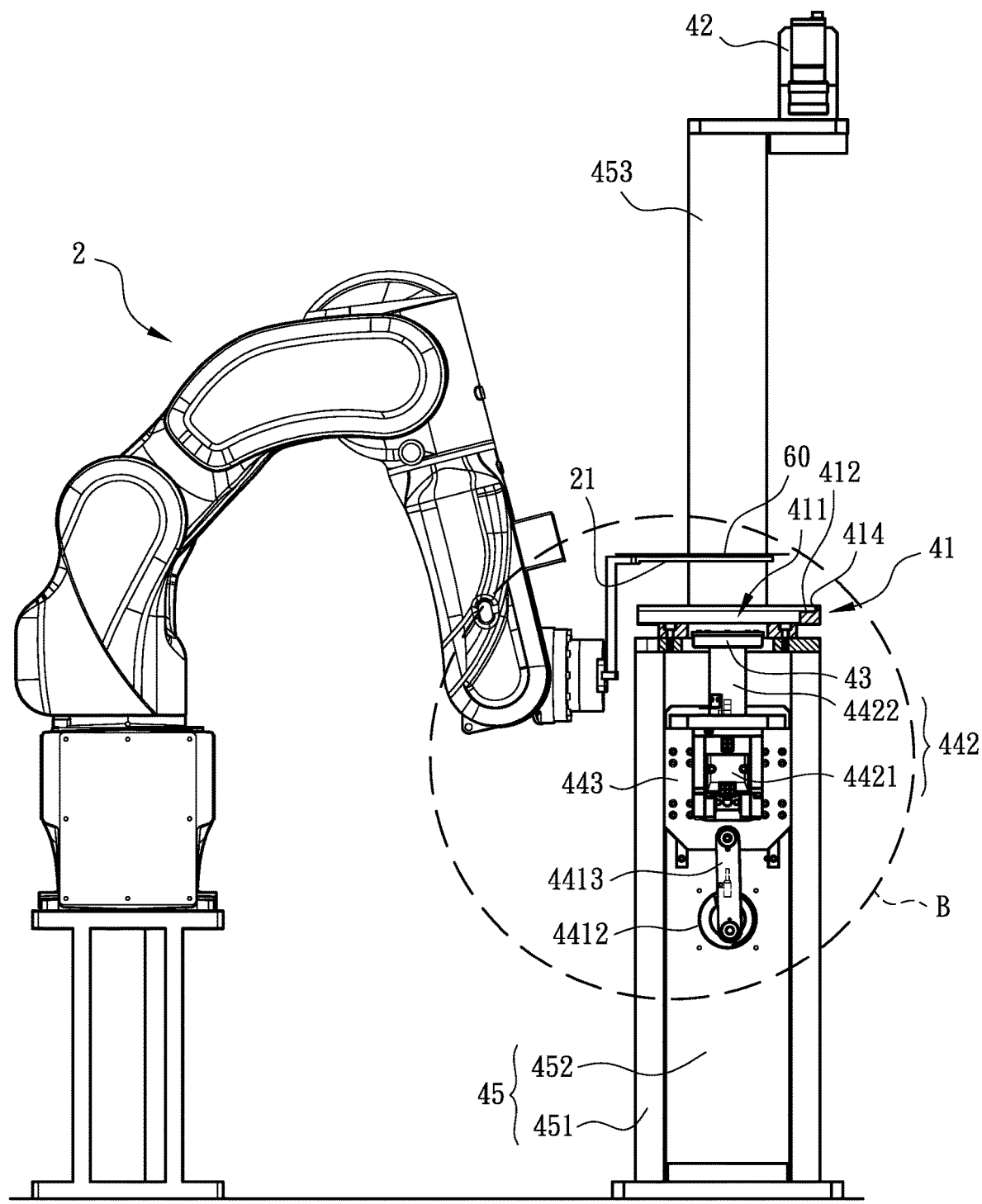
FIG. 15 is a side view of a part of FIG. 14.
Figure 16:
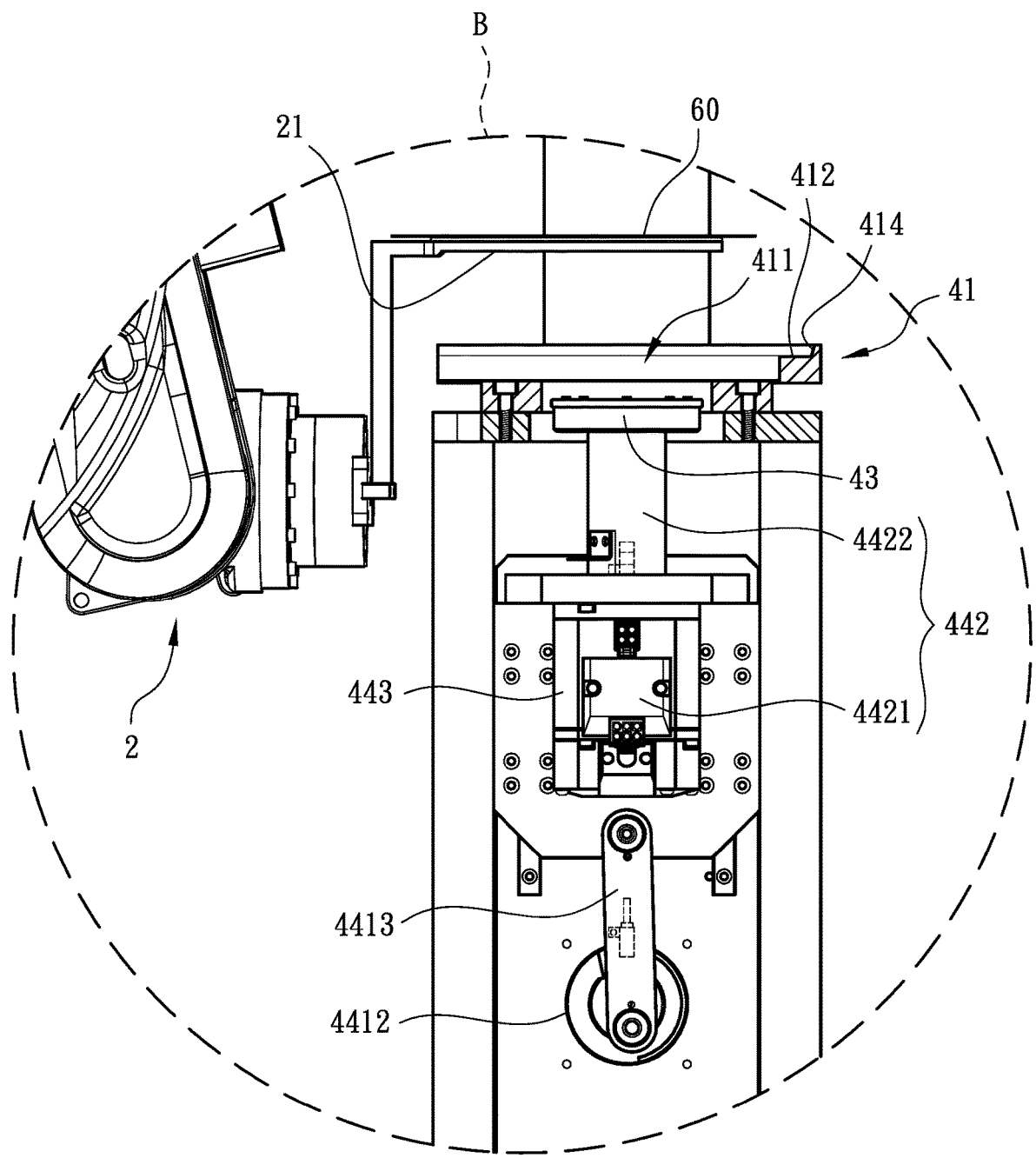
FIG. 16 is an enlarged view of circled area B of FIG. 15.

REFERENCE NUMBERS OF DRAWINGS 1 first robotic arm; 11 image capturing assembly; 111 upper image capturing component; 12 wafer locating member installation/uninstallation mechanism; 121 locating face; 122 locating scale; 123 holding component; 124 laser source; 2 second robotic arm; 21 wafer taking/placing mechanism; 211 indication scale; 3 main correction mechanism; 31 range-finding laser source; 311 laser beam; 32 lower image capturing component; 33 transparent sheet; 331 standard scale; 4 wafer correction mechanism; 41 rest seat; 411 through hole; 412 flange; 413 recessed section; 414 guide slope; 42 image capturing unit; 43 sucker; 431 vacuum sucking orifice; 44 rotational drive assembly; 441 lifting module; 4411 lifting power source; 4412 cam; 4413 link; 442 pivotally rotational module; 4421 pivotally rotational power source; 4422 pivotally rotational shaft; 443 slide seat; 4431 guide rail; 45 support module; 451 support leg; 452 lower side support; 453 upper side support; 5 carrier disc; 51 wafer disc; 511 wafer locating member; 52 outer cover; 521 breach; 53 slide mechanism; 531 slide seat; 532 slide guide rail; 533 pivotally rotational seat; 6 material rest mechanism; 60 wafer; 61 lifting mechanism; S11 adjusting the focal length of the lens of the upper image capturing component corresponding to the standard scale; S12 comparing and finding the difference between the position of the standard scale obtained by the lower image capturing component and the position of the standard scale obtained by the upper image capturing component; S13 setting up a reference point coordinate of the first robotic arm; S14 adjusting the focal length of the lens of the lower image capturing component corresponding to the locating scale; S15 comparing and finding the difference between the position of the locating scale and the position of the standard scale obtained by the lower image capturing component; S16 setting up true operation position of the wafer locating member installation/uninstallation mechanism; S17 adjusting the focal length of the lens of the lower image capturing component corresponding to the indication scale; S18 comparing and finding the difference between the position of the indication scale and the position of the standard scale obtained by the lower image capturing component; S19 setting up a reference point coordinate of the second robotic arm; S20 using the wafer taking/placing mechanism to place the wafer on the rest seat; S21 making the image capturing unit correspond to a portion of the circumference of the wafer; S22 using the rotational drive assembly to drive the wafer to rotate by 360 degrees for the image capturing unit to obtain full image of the circumference of the wafer; S23 using the rotational drive assembly to drive the wafer to rotate to true angular position; A enlarged view of wafer locating member installation/uninstallation mechanism of FIG. 10; B enlarged view of rotational drive assembly of FIG. 15; C enlarged view of rotational drive assembly of FIG. 18; D projection range of image capturing unit

DETAILED DESCRIPTION OF THE PREFERRED EMBODIMENTS

Please refer to FIGS. 1 to 4. The main structure of the present invention includes a first robotic arm 1, a second robotic arm 2, a main correction mechanism 3 and a wafer correction mechanism 4. The first robotic arm 1 is connected with and drivable by a control module, (which can be a computer with operation function, not shown) to perform multiaxial pivotal rotation. An image capturing assembly 11 and a wafer locating member installation/uninstallation mechanism 12 are respectively disposed at a movable end of the first robotic arm 1. The image capturing assembly 11 includes an upper image capturing component 111 with an illuminator, (which can be a CCD camera). The wafer locating member installation/uninstallation mechanism 12 has a locating face 121. A locating scale 122, (which can be a perforation or a scale) is disposed at (the center of) the locating face 121. At least two oppositely movable holding components 123 are disposed on an outer circumference of the locating face 121. Multiple laser sources 124 are uniformly distributed along the circumference of the locating face 121 of the wafer locating member installation/uninstallation mechanism 12. The multiple laser sources 124 are respectively disposed at at least three points beside the locating face 121.

The second robotic arm 2 is connected with and drivable by the control module to perform multiaxial pivotal rotation. A wafer taking/placing mechanism 21 is disposed at a movable end of the second robotic arm 2. An indication scale 211 is disposed on the wafer taking/placing mechanism 21. In a preferred embodiment, the wafer taking/placing mechanism 21 is a wafer sucker with vacuum sucking force.

The main correction mechanism 3 is positioned within a common moving range of the first and second robotic arms 1, 2. The main correction mechanism 3 is connected with and drivable by the control module. The main correction mechanism 3 has a lower image capturing component 32 with an illuminator, (which can be a CCD camera) and at least one range-finding laser source 31 with range-finding function. A transparent sheet 33 is disposed above the lower image capturing component 32. A standard scale 331 is disposed at the center of the transparent sheet 33.

The wafer correction mechanism 4 is positioned within the moving range of the second robotic arm 2 and is connected with and drivable by the control module. The wafer correction mechanism 4 is mainly composed of a rest seat 41, an image capturing unit 42, a sucker 43 and a rotational drive assembly 44. A center of the rest seat 41 is formed with a through hole 411. A flange 412 is annularly disposed along a circumference of the rest seat 41. An inward extending guide slope 414 protrudes from an outer circumference of the flange 412. A recessed section 413 is formed on a portion of the flange 412.

In a preferred embodiment, the rest seat 41 is disposed on multiple support legs 451 of a support module 45. A vertical lower side support 452 is disposed on one side of the support legs 451. An upper side support 453 upward extends from another side of the support legs 451.

The image capturing unit 42 is disposed above the rest seat 41. In a preferred embodiment, the image capturing unit 42 is secured to one end of the upper side support 453 distal from the lower side support 452 and directed to the rest seat 41. The image capturing unit 42 can be a CCD camera.

The sucker 43 is disposed under the rest seat 41 corresponding to the through hole 411. Multiple vacuum sucking orifices 431 are arranged along a circumference of one side of the sucker 43 proximal to the through hole 411.

The rotational drive assembly 44 is disposed under the rest seat 41 and connected with the sucker 43. In a preferred embodiment, the rotational drive assembly 44 has a lifting module 441, a pivotally rotational module 442, and a slide seat 443. The slide seat 443 can vertically slide along multiple guide rails 4431 vertically disposed on the lower side support 452. The lifting module 441 is disposed on the lower side support 452, including a lifting power source 4411, (which can be a servomotor), a cam 4412 drivable by the lifting power source 4411 to pivotally rotate and a link 4413. One end of the link 4413 is pivotally connected with a circumference of the cam 4412, while the other end of the link 4413 is pivotally connected with the slide seat 443. The pivotally rotational module 442 has a pivotally rotational power source 4421, (which can be a servomotor), disposed on the slide seat 443. A pivotally rotational shaft 4422 is disposed on the pivotally rotational power source 4421 and connected with the sucker 43.

Figure 1:
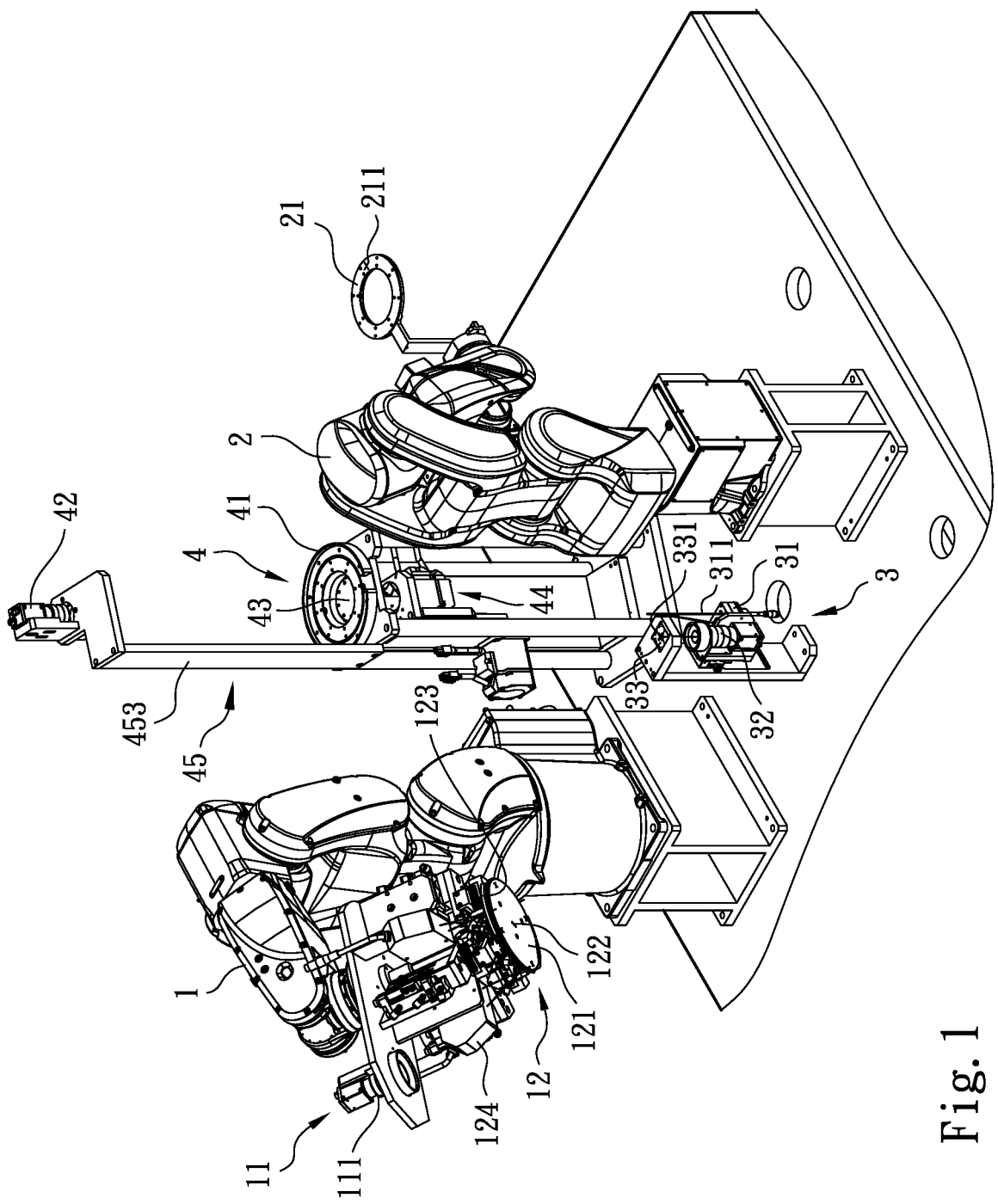
FIG. 1 is a perspective view of the entire structure of the present invention.
Figure 2:
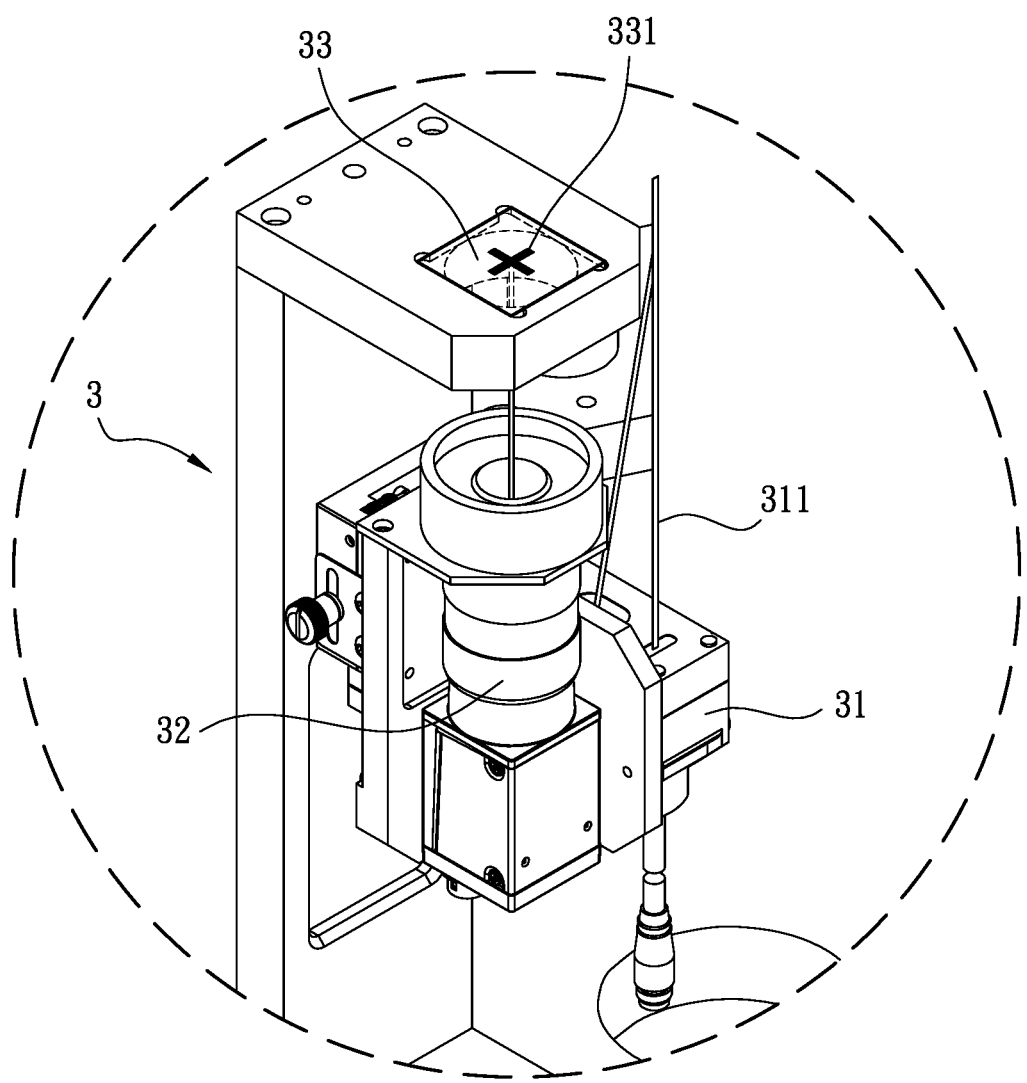
FIG. 2 is an enlarged view of a part of the main correction mechanism of the present invention.
Figure 3:
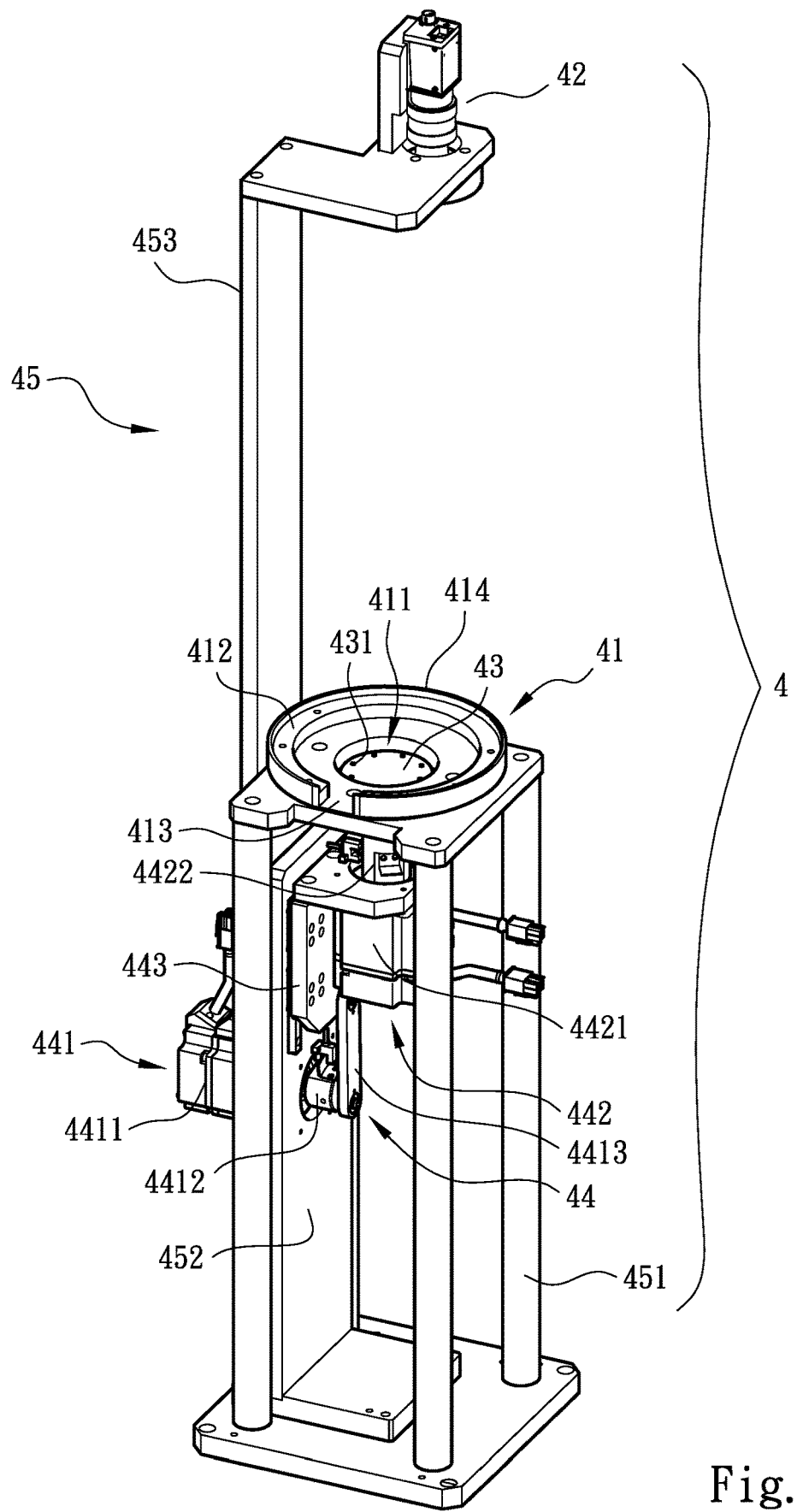
FIG. 3 is an enlarged view of a part of the wafer correction mechanism of the present invention.
Figure 4:
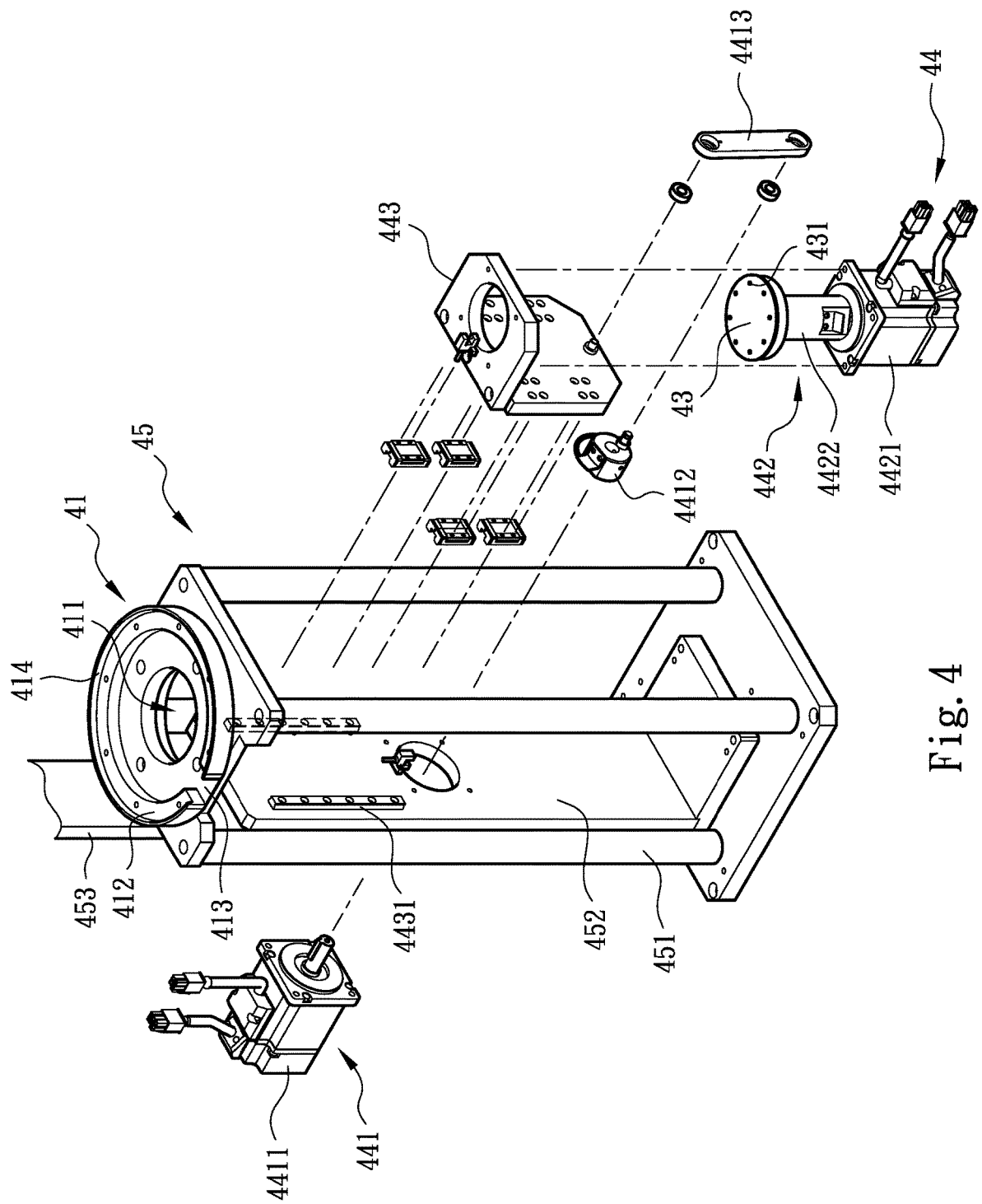
FIG. 4 is a perspective exploded view of the rotational drive assembly of the present invention.
Figure 5:
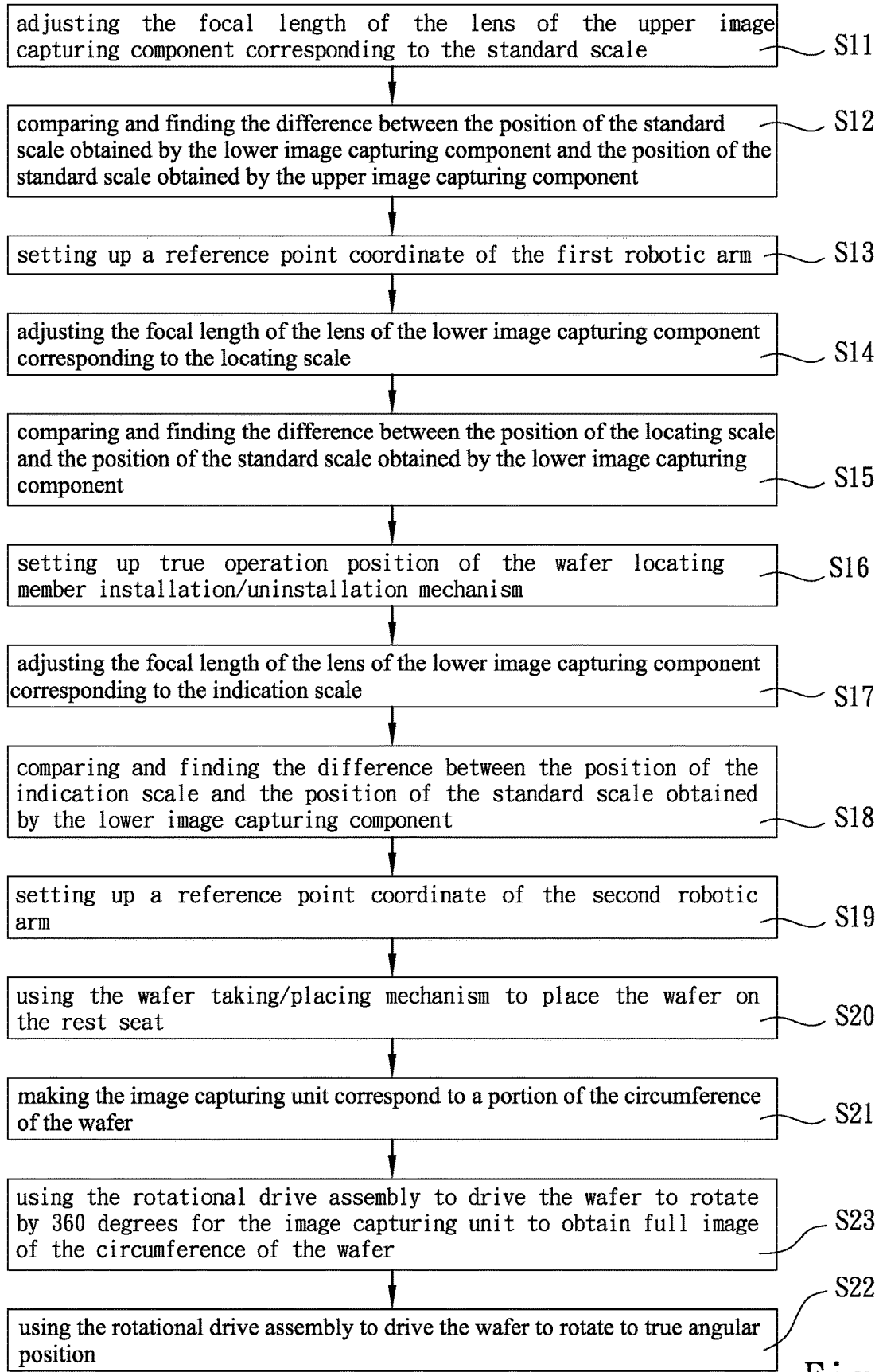
FIG. 5 is a flow chart of the correction method of the present invention.

Please refer to FIG. 5. The correction method of the present invention includes step S11 of adjusting the focal length of the lens of the upper image capturing component corresponding to the standard scale, step S12 of comparing and finding the difference between the position of the standard scale obtained by the lower image capturing component and the position of the standard scale obtained by the upper image capturing component, step S13 of setting up a reference point coordinate of the first robotic arm, step S14 of adjusting the focal length of the lens of the lower image capturing component corresponding to the locating scale, step S15 of comparing and finding the difference between the position of the locating scale and the position of the standard scale obtained by the lower image capturing component, step S16 of setting up true operation position of the wafer locating member installation/uninstallation mechanism, step S17 of adjusting the focal length of the lens of the lower image capturing component corresponding to the indication scale, step S18 of comparing and finding the difference between the position of the indication scale and the position of the standard scale obtained by the lower image capturing component, step S19 of setting up a reference point coordinate of the second robotic arm, step S20 of using the wafer taking/placing mechanism to place the wafer on the rest seat, step S21 of making the image capturing unit correspond to a portion of the circumference of the wafer, step S22 of using the rotational drive assembly to drive the wafer to rotate by 360 degrees for the image capturing unit to obtain full image of the circumference of the wafer and step S23 of using the rotational drive assembly to drive the wafer to rotate to true angular position. The above steps and a practical embodiment of the present invention will be respectively described with reference to FIGS. 6 to 25 hereinafter.

In order to facilitate description of the practical embodiment as shown in FIGS. 6 to 25, a carrier disc 5 is disposed within the moving range of the first and second robotic arms 1 and 2, on which multiple wafer discs 51 are rested. The carrier disc 5 is disposed on a slide mechanism 53. The slide mechanism 53 has a slide seat 531 disposed on multiple slide guide rails 532 extending in parallel to each other. A pivotally rotational seat 533 is disposed on the slide seat 531, on which the carrier disc 5 is rested. An outer cover 52 is securely disposed above one end of the slide guide rails 532. The outer cover 52 is formed with a breach 521. When the carrier disc 5 is positioned at one end of the slide guide rails 532, the outer cover 52 is positioned above the carrier disc 5 to shield the same and some of the wafer discs 51 are exposed to outer side through the breach 521. The control module serves to operate the slide mechanism 53 to make the slide seat 531 drive the pivotally rotational seat 533 and the carrier disc 5 to slide between two ends of the slide guide rails 532. In addition, the pivotally rotational seat 533 can drive the carrier disc 5 to pivotally rotate.

In addition, a material rest mechanism 6, (which can be a material cartridge), is disposed within the moving range of the second robotic arm 2. Multiple wafers 60 can be received in the material rest mechanism 6. The material rest mechanism 6 is disposed on a lifting mechanism 61, whereby the lifting mechanism 61 can drive the material rest mechanism 6 to ascend or descend. In practice, the material rest mechanism 6 can cooperate with other components to perform different operations and achieve difference effects. The material rest mechanism 6 is not limited to the contents shown in the drawings.

Figure 6:
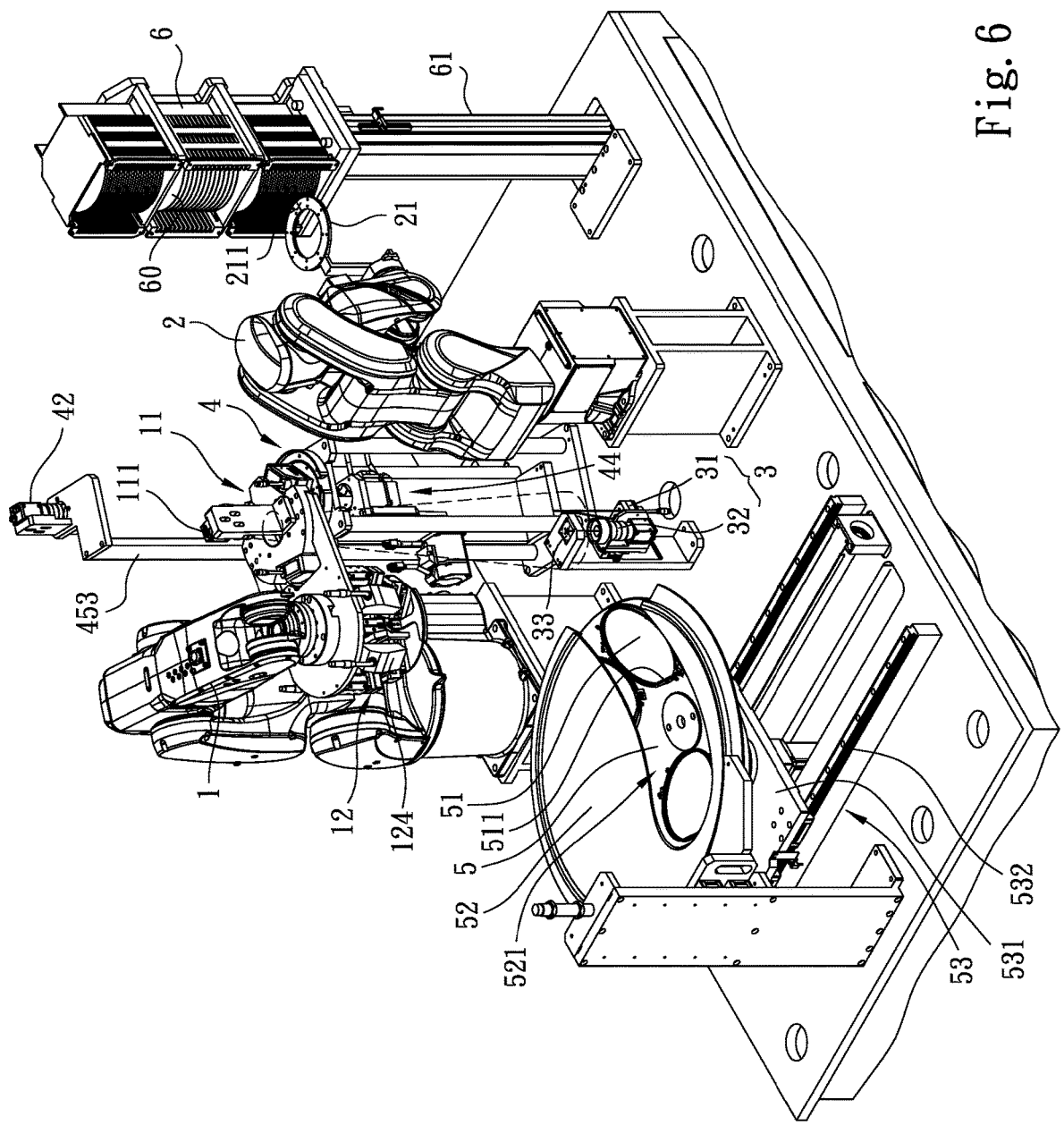
FIG. 6 is a perspective view of the present invention, showing that the image capturing assembly is positioned above the main correction mechanism.

First, in step S11 of adjusting the focal length of the lens of the upper image capturing component corresponding to the standard scale, the first robotic arm 1 drives the image capturing assembly 11 to move to upper side of the main correction mechanism 3 (as shown in FIG. 6). The range-finding laser source 31 of the main correction mechanism 3 generates and projects laser beam 311 onto a predetermined section of the image capturing assembly 11 (the upper image capturing component 111) so as to measure the distance between the main correction mechanism 3 and the image capturing assembly 11 (the upper image capturing component 111) and adjust the focal length of the lens of the upper image capturing component 111 corresponding to the standard scale 331. Accordingly, the upper image capturing component 111 can easily obtain a clear position image of the standard scale 331 on the transparent sheet 33.

In step S12 of comparing and finding the difference between the position of the standard scale obtained by the lower image capturing component and the position of the standard scale obtained by the upper image capturing component, the lower image capturing component 32 (the focal length of the lens has been previously truly adjusted) directly upward obtains the position image of the standard scale 331 on the transparent sheet 33 to form a lower standard position image. In addition, the upper image capturing component 111 downward obtains a clear position image of the standard scale 331 on the transparent sheet 33 to form an upper standard position image. The control module compares the lower standard position image with the upper standard position image to find the difference therebetween.

In step S13 of setting up a reference point coordinate of the first robotic arm, the first robotic arm 1 drives the image capturing assembly 11 to move to an image correction position and make the lower standard position image overlap with the upper standard position image so as to correct the image capturing range of the image capturing assembly 11. The control module stores the coordinate of the image capturing correction position (the true image capturing range) of the image capturing assembly 11 to form the reference point (original point) coordinate of the first robotic arm 1.

Figure 7:
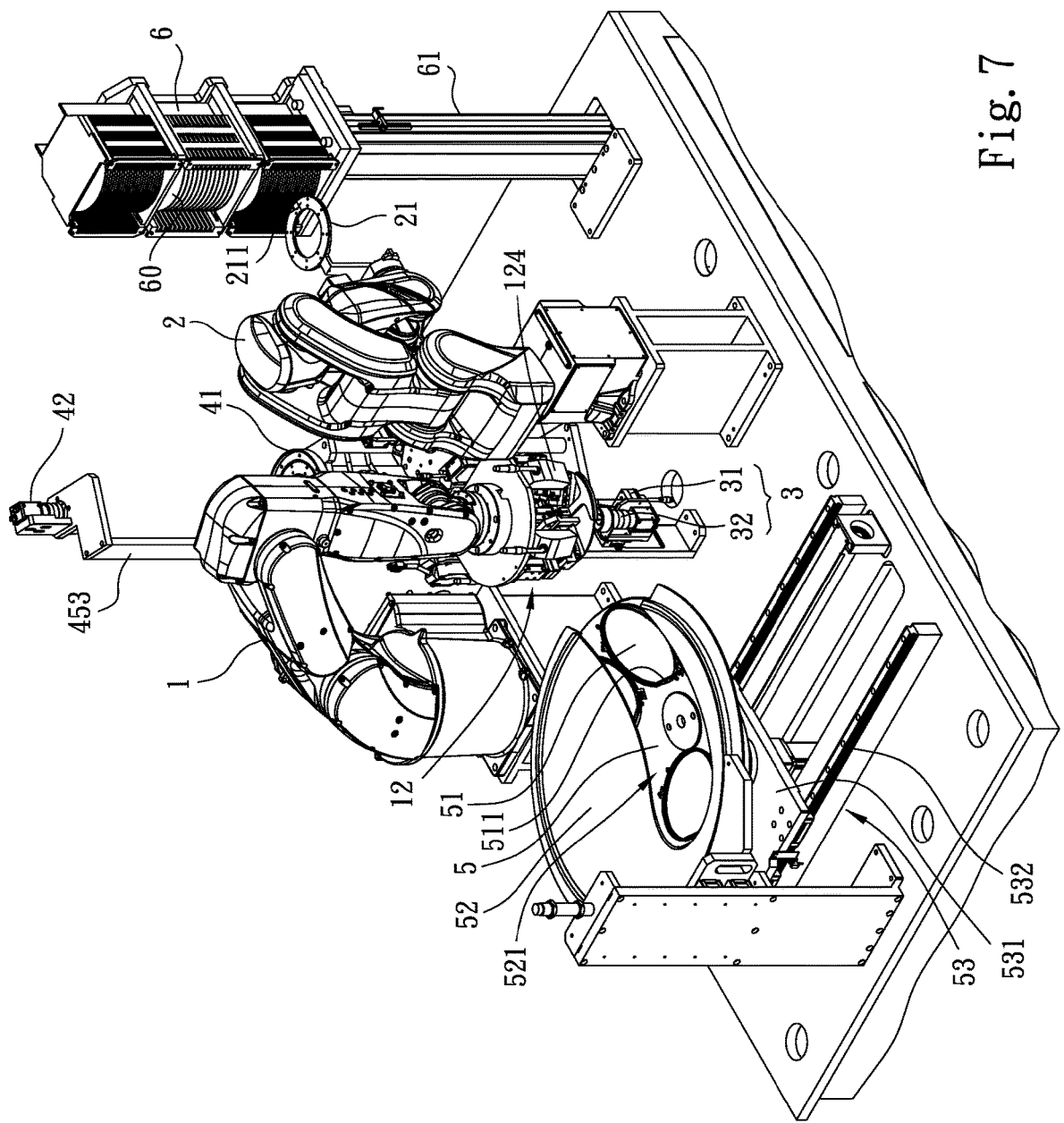
FIG. 7 is a perspective view of the present invention, showing that the wafer locating member installation/uninstallation mechanism is positioned above the main correction mechanism.

In step S14 of adjusting the focal length of the lens of the lower image capturing component corresponding to the locating scale, the first robotic arm 1 drives the wafer locating member installation/uninstallation mechanism 12 to move to the upper side of the main correction mechanism 3 (as shown in FIG. 7). The range-finding laser source 31 of the main correction mechanism 3 generates and projects laser beam 311 onto the locating face 121 of the wafer locating member installation/uninstallation mechanism 12 so as to measure the distance between the main correction mechanism 3 and the locating face 121 and adjust the focal length of the lens of the lower image capturing component 32 corresponding to the locating scale 122 on the locating face 121.

In step S15 of comparing and finding the difference between the position of the locating scale and the position of the standard scale obtained by the lower image capturing component, the lower image capturing component 32 directly upward observes and obtains the position image of the standard scale 331 on the transparent sheet 33, (that is, the lower standard position image). Also, the lower image capturing component 32 upward (through the transparent sheet 33) observes the locating scale 122 (a perforation or a scale) on the locating face 121 and obtains the position image of the locating scale 122 to form a locating position image. The control module compares the lower standard position image with the locating position image and finds the difference therebetween.

In step S16 of setting up true operation position of the wafer locating member installation/uninstallation mechanism, the first robotic arm 1 drives the wafer locating member installation/uninstallation mechanism 12 to move to an installation/uninstallation correction position and make the lower standard position image overlap with the locating position image so as to correct the operation position of the wafer locating member installation/uninstallation mechanism 12. The control module stores the coordinate of the installation/uninstallation correction position (the true operation position) of the wafer locating member installation/uninstallation mechanism 12 and calculates and stores the relative coordinate between the image capturing correction position and the installation/uninstallation correction position.

In the above steps, after the image capturing assembly 11 is corrected by the main correction mechanism 3, a reference point (original point) coordinate is set up as a starting standard of the first robotic arm 1. Also, after the wafer locating member installation/uninstallation mechanism 12 is corrected by the main correction mechanism 3, a relative coordinate between the wafer locating member installation/uninstallation mechanism 12 and the image capturing assembly 11 is produced, whereby a relative position relationship between the wafer locating member installation/uninstallation mechanism 12 and the image capturing assembly 11 can be set up. In successive operations, the image capturing assembly 11 with image capturing function is first located in a true position on a section to be operated (such as the wafer disc). Then, by means of the relative coordinate, the wafer locating member installation/uninstallation mechanism 12 can directly quickly move to the true position for performing successive processing operations.

Figure 8:
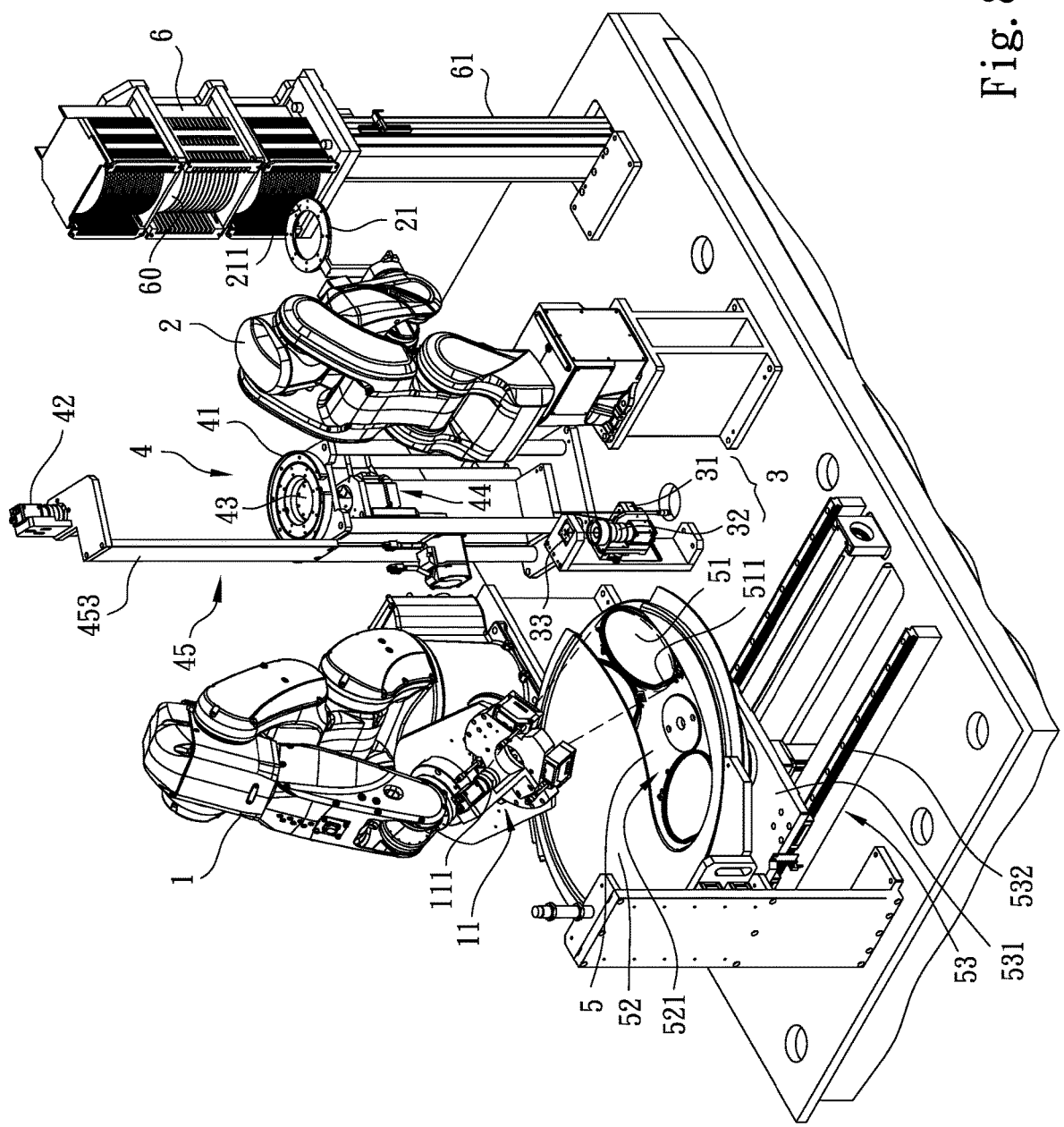
FIG. 8 is a perspective view of the present invention, showing that in practice, the image capturing assembly is positioned above the carrier disc to truly correspond to the wafer disc.
Figure 9:
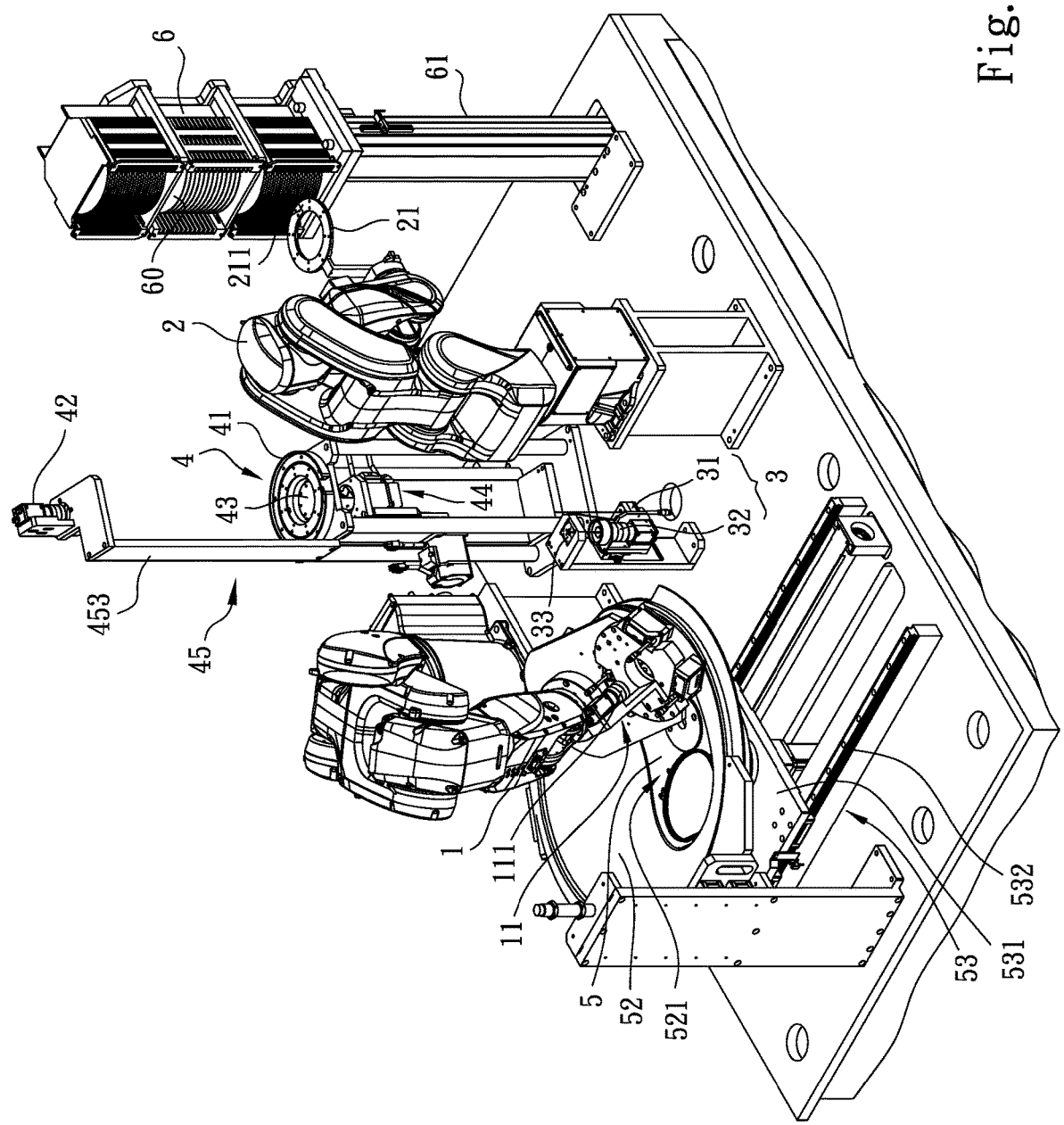
FIG. 9 is a perspective view of the present invention, showing that in practice, the wafer locating member installation/uninstallation mechanism is moved onto the wafer disc.
Figure 10:
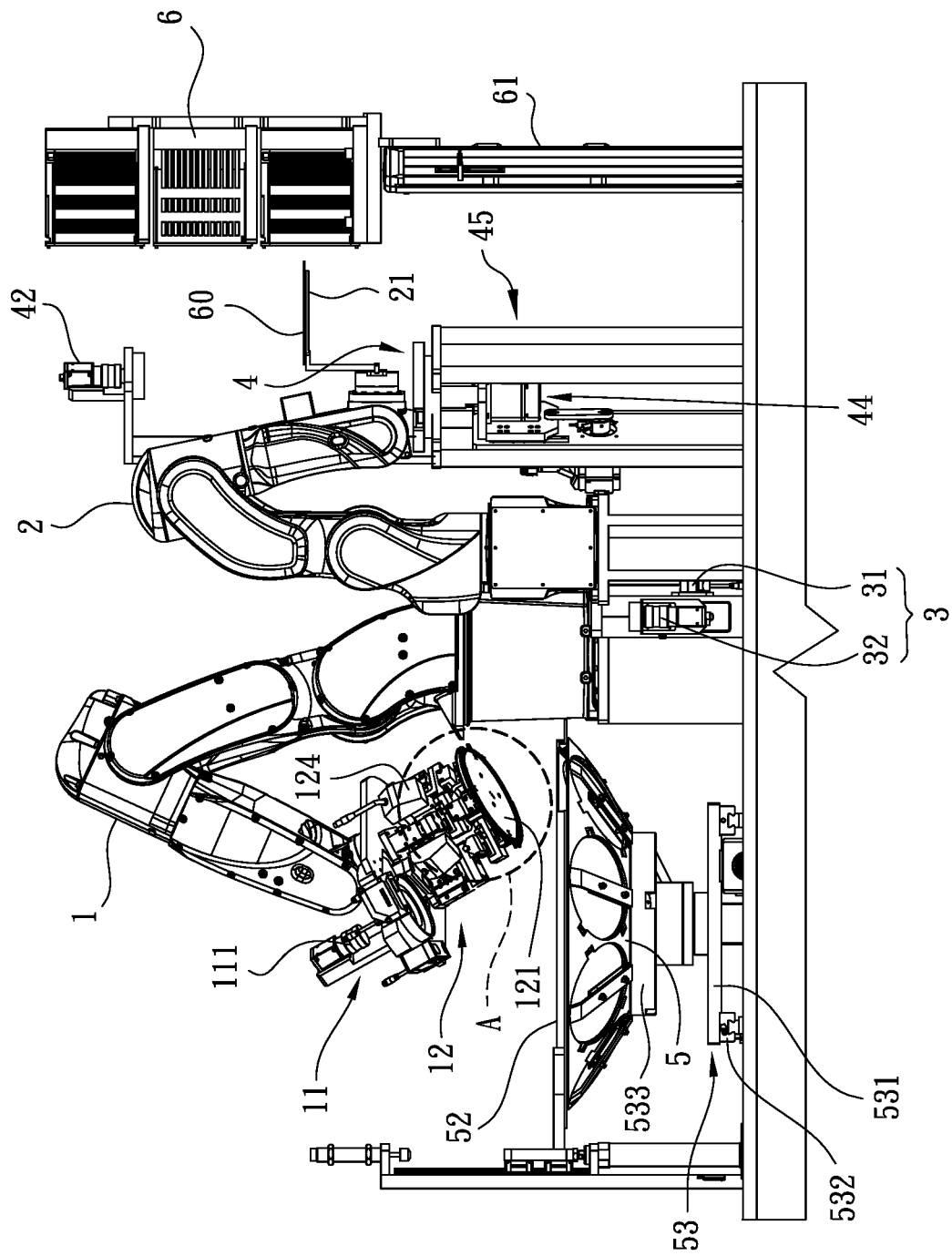
FIG. 10 is a perspective view of the present invention, showing that in practice, the wafer locating member installation/uninstallation mechanism takes off the wafer locating member.
Figure 11:
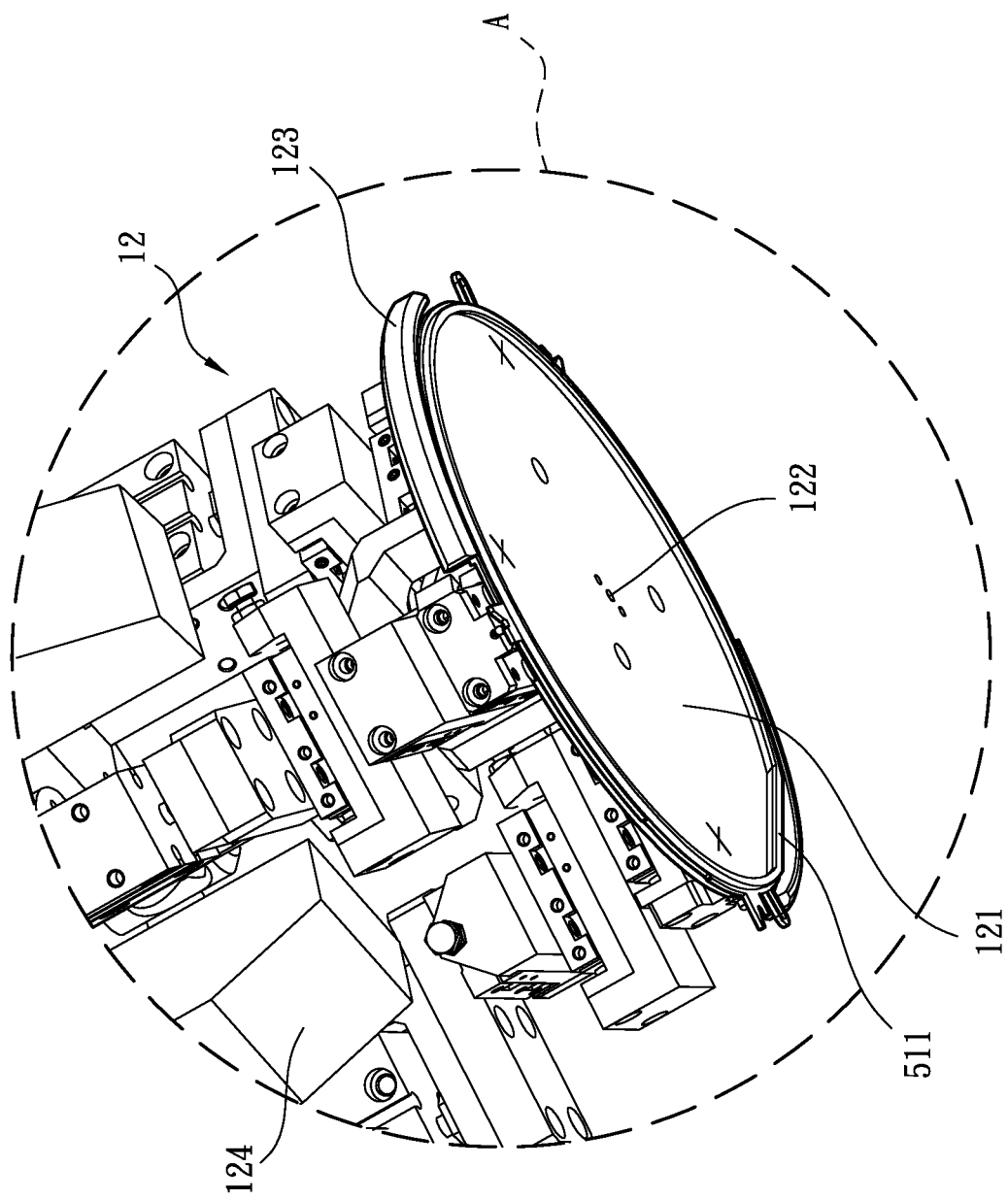
FIG. 11 is an enlarged view of circled area A of FIG. 10.

Please refer to FIGS. 8 to 11. In practice, after the wafer locating member installation/uninstallation mechanism 12 and the image capturing assembly 11 are corrected by the main correction mechanism 3, the first robotic arm 1 can drive the image capturing assembly 11 to move to the upper side of the outer cover 52 (as shown in FIG. 8). The image capturing assembly 11 is directed to the wafer disc 51 corresponding to the breach 521 to capture the image of the wafer disc 51 so as to check the condition on the wafer disc 51 (whether a chip or fragment of the wafer 60 remains thereon). By means of the image, the image capturing assembly 11 is located in a true position. Then, with reference to the relative position coordinate, the control module drives the first robotic arm 1 to drive the wafer locating member installation/uninstallation mechanism 12 to approach the wafer disc 51. The laser source 124 generates and projects multiple (at least three) laser beams with the same length onto the wafer disc 51 so as to make the locating face 121 aligned with (in parallel to) the wafer disc 51 (as shown in FIG. 9). Then, after the wafer locating member 511 previously disposed on the circumference of the wafer disc 51 is unlocked, the holding components 123 are used to take out the wafer locating member 511 and keep in a holding state (as shown in FIGS. 10 and 11).

Figure 12:
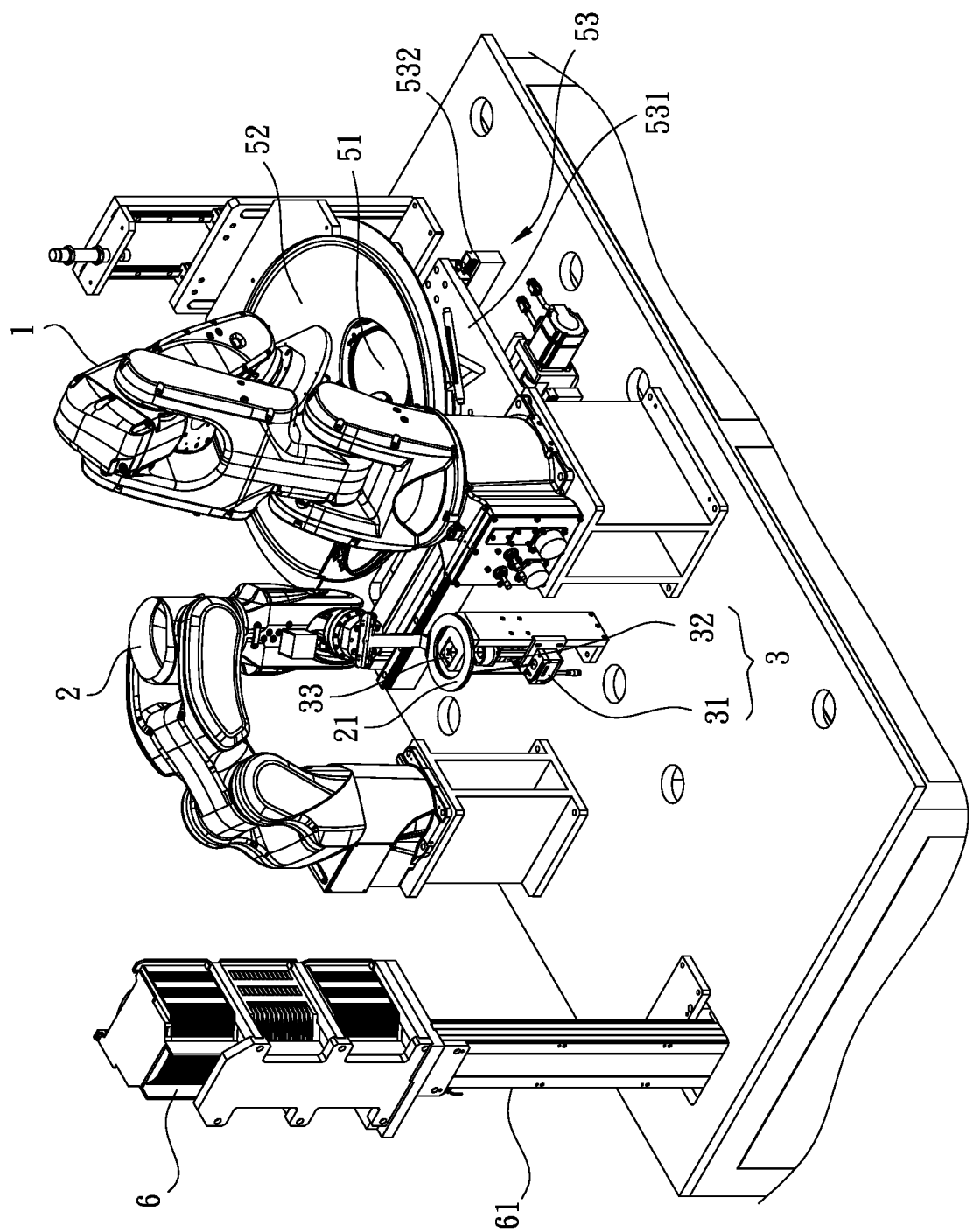
FIG. 12 is a perspective view of the present invention, showing that the wafer taking/placing mechanism is positioned above the main correction mechanism.
Figure 13:
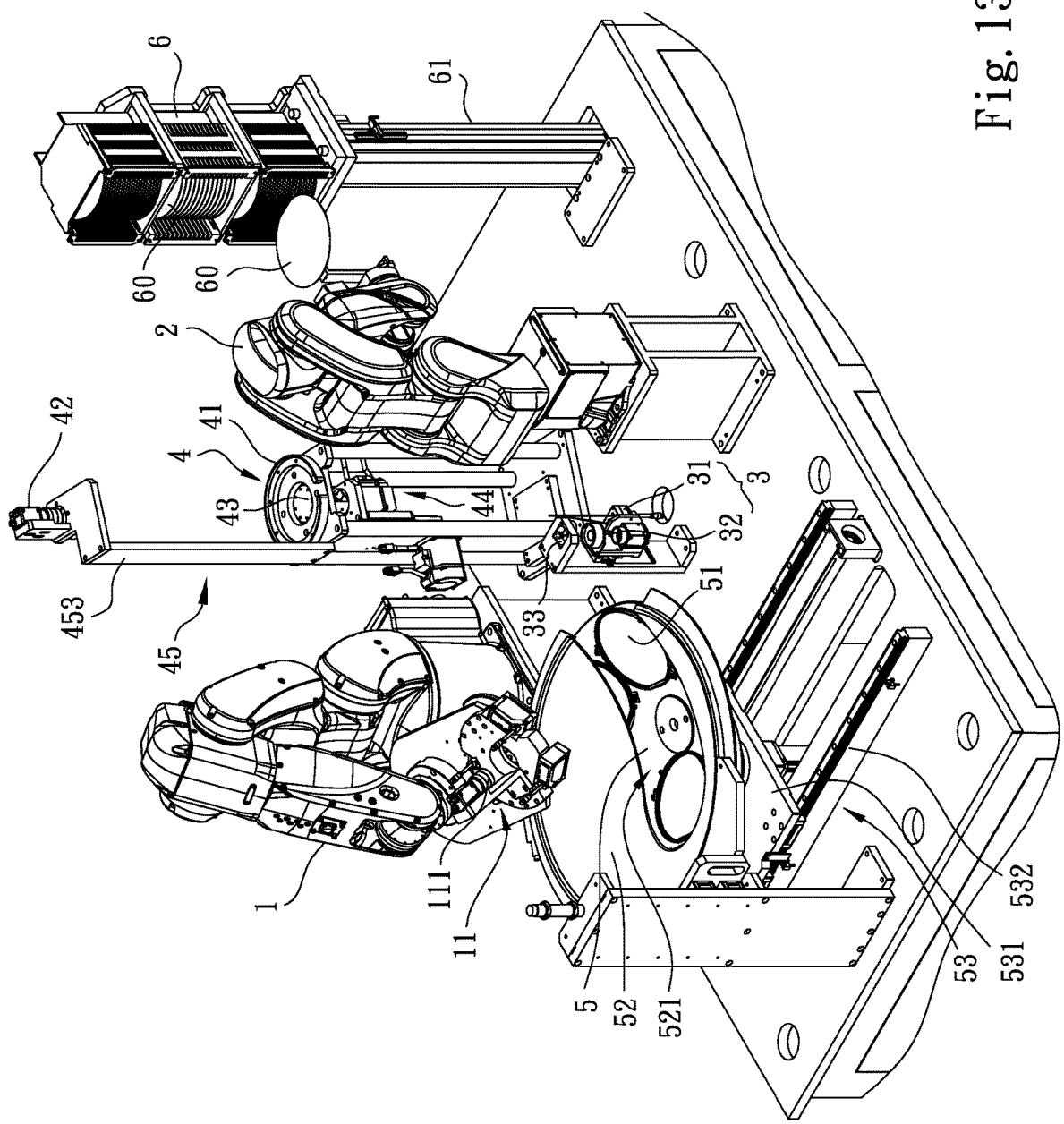
FIG. 13 is a perspective view of the present invention, showing that the wafer taking/placing mechanism takes out the wafer from the material rest mechanism.
Figure 14:
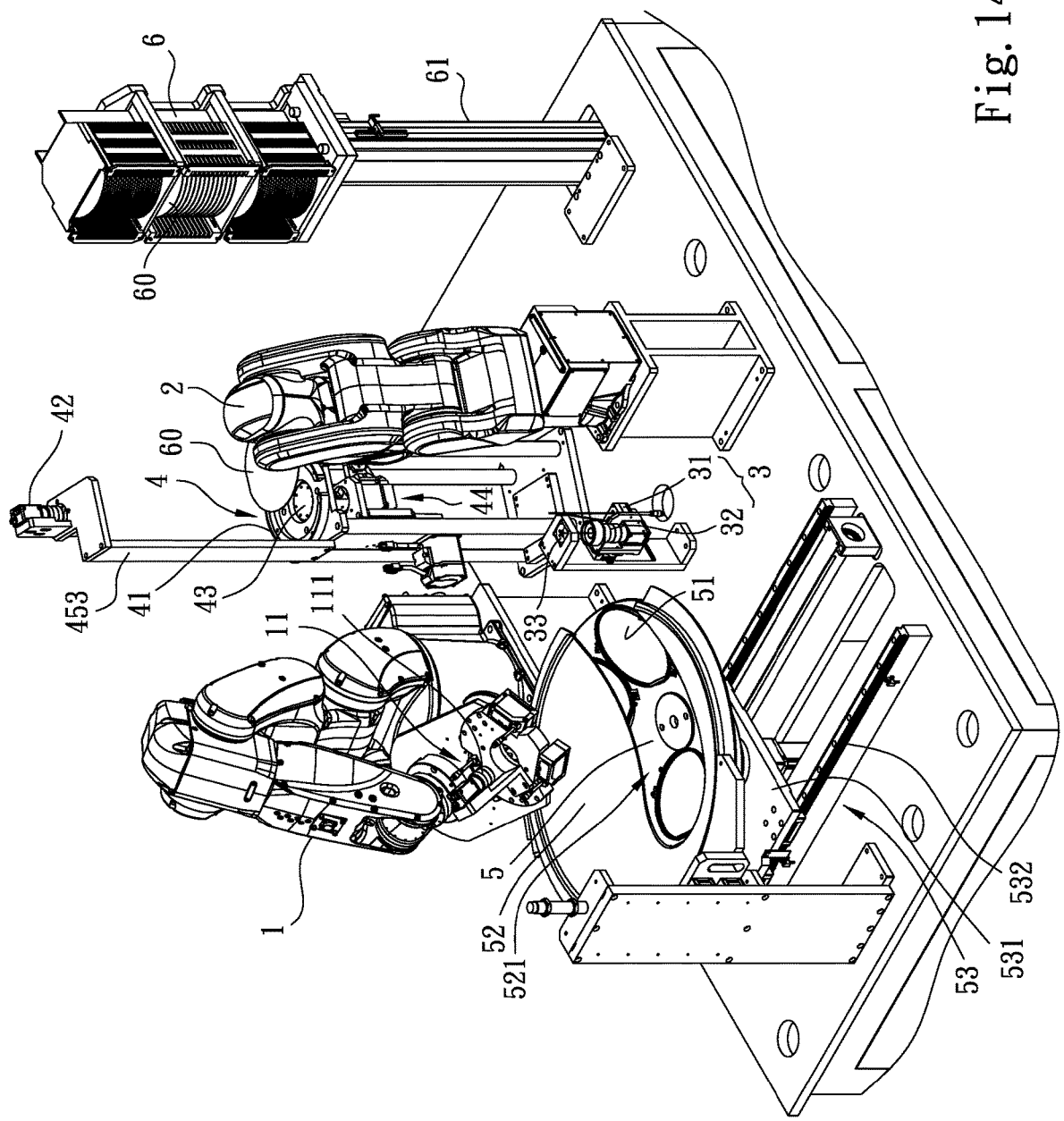
FIG. 14 is a perspective view of the present invention, showing the operation that the wafer taking/placing mechanism moves the wafer onto the wafer correction mechanism.

In step S17 of adjusting the focal length of the lens of the lower image capturing component corresponding to the indication scale, the second robotic arm 2 drives the wafer taking/placing mechanism 21 to move to the upper side of the main correction mechanism 3 (as shown in FIG. 12). The range-finding laser source 31 of the main correction mechanism 3 generates and projects laser beams 311 onto the wafer taking/placing mechanism 21 (the indication scale 211) so as to measure the distance between the main correction mechanism 3 and the wafer taking/placing mechanism 21 (the indication scale 211) and adjust the focal length of the lens of the lower image capturing component 32 corresponding to the wafer taking/placing mechanism 21 (the indication scale 211).

In step S18 of comparing and finding the difference between the position of the indication scale and the position of the standard scale obtained by the lower image capturing component, the lower image capturing component 32 directly obtains the position image of the standard scale 331 on the transparent sheet 33, (that is, the lower standard position image). Also, the lower image capturing component 32 (through the transparent sheet 33) observes the indication scale 211 on the wafer taking/placing mechanism 21 and obtains the position image of the indication scale 211 to form an indication position image. Then the control module compares the lower standard position image with the indication position image and finds the difference therebetween.

In step S19 of setting up a reference point coordinate of the second robotic arm, the second robotic arm 2 drives the wafer taking/placing mechanism 21 to move to a taking/placing correction position and make the lower standard position image overlap with the indication position image so as to correct the operation position of the wafer taking/placing mechanism 21. The control module stores the coordinate of the taking/placing correction position (the true operation position) of the wafer taking/placing mechanism 21 to form a reference point (original point) coordinate of the second robotic arm 2.

In the above steps, after the wafer taking/placing mechanism 21 is corrected by the main correction mechanism 3, a reference point (original point) coordinate is set up as a starting standard of the second robotic arm 2. The second robotic arm 2 and the first robotic arm 1 have the same reference point coordinate so as to form a precise connection relationship therebetween.

In step S20 of using the wafer taking/placing mechanism to place the wafer on the rest seat, after the wafer taking/placing mechanism 21 is corrected by the main correction mechanism 3, the second robotic arm 2 drives the wafer taking/placing mechanism 21 to move into the material rest mechanism 6 to take out a wafer 60 to be processed (as shown in FIGS. 13, 14, 15 and 16). Then the wafer 60 is moved to the upper side of the rest seat 41 of the wafer correction mechanism 4. At this time, the slide seat 443 and the pivotally rotational module 442 are positioned in an initial position of a lowermost point. Then the second robotic arm 2 descends to make the wafer taking/placing mechanism 21 extend into the recessed section 413. The wafer 60 is guided by the guide slope 414 to precisely fall into a predetermined position on the flange 412 of the rest seat 41. Then the wafer taking/placing mechanism 21 downward separates from the wafer 60.

Figure 17:
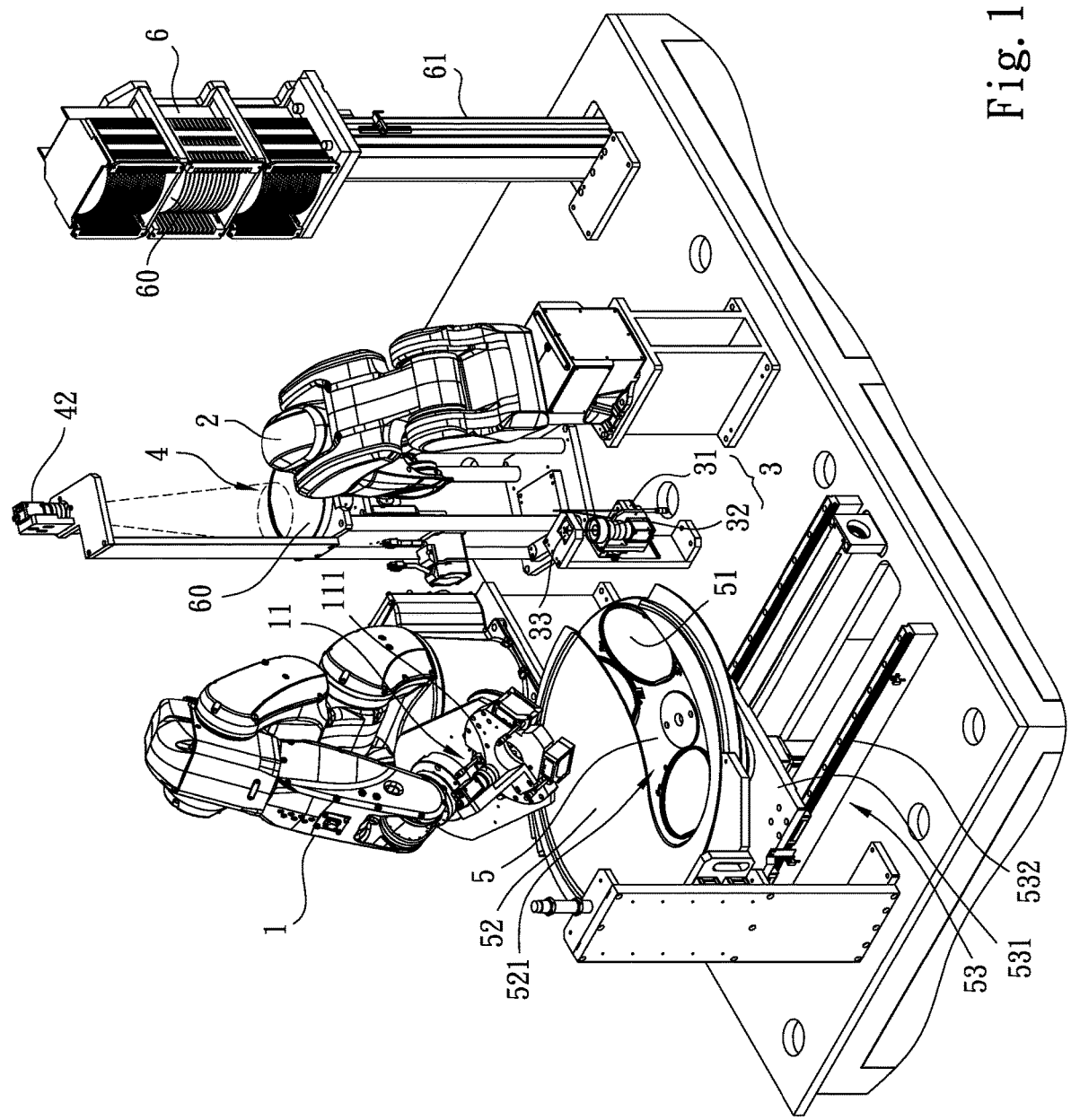
FIG. 17 is a perspective view of the present invention, showing the operation that the wafer is placed on the rest seat and the image capturing unit obtains the image of the wafer.
Figure 18:
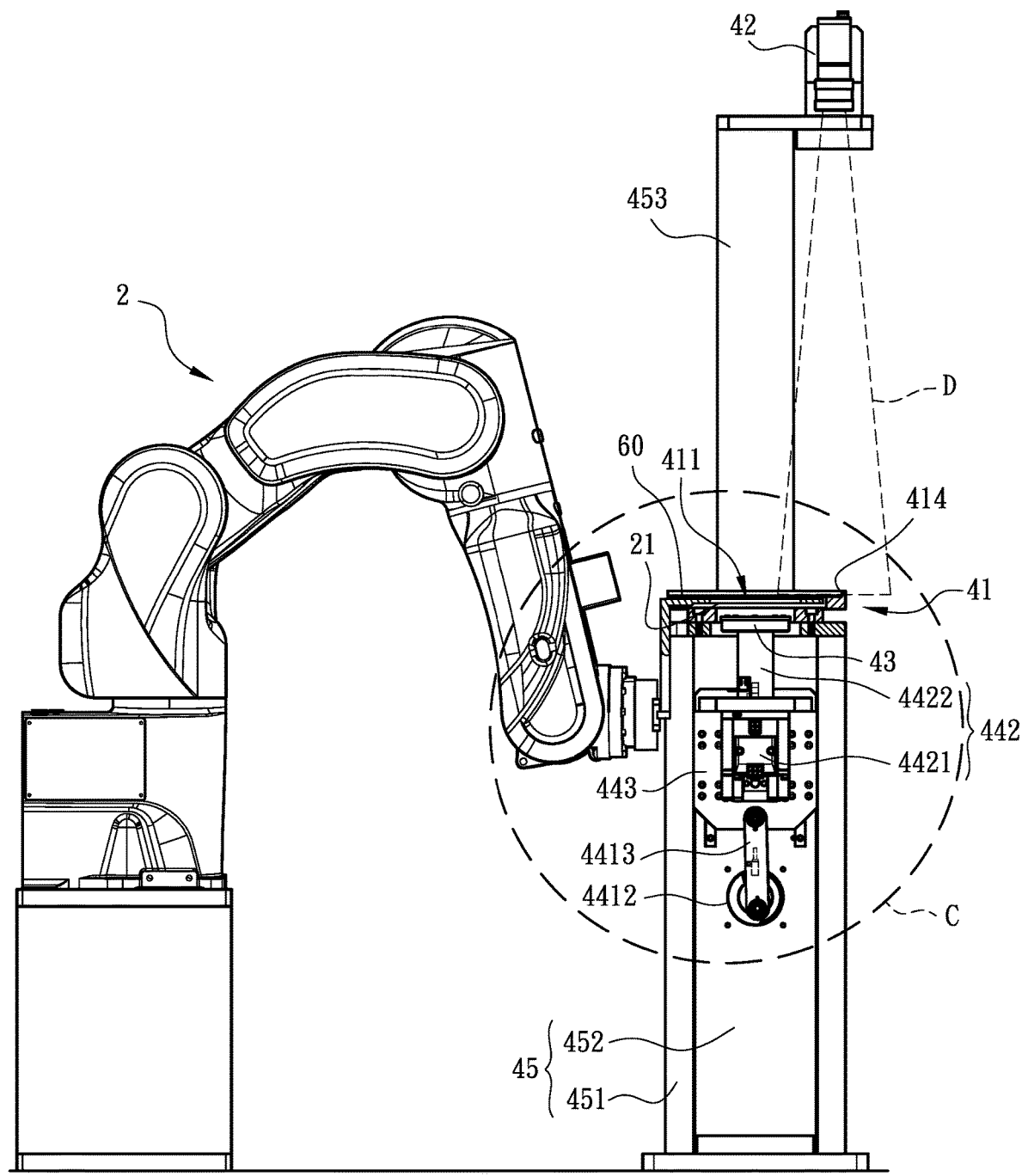
FIG. 18 is a side view of a part of FIG. 17.
Figure 19:
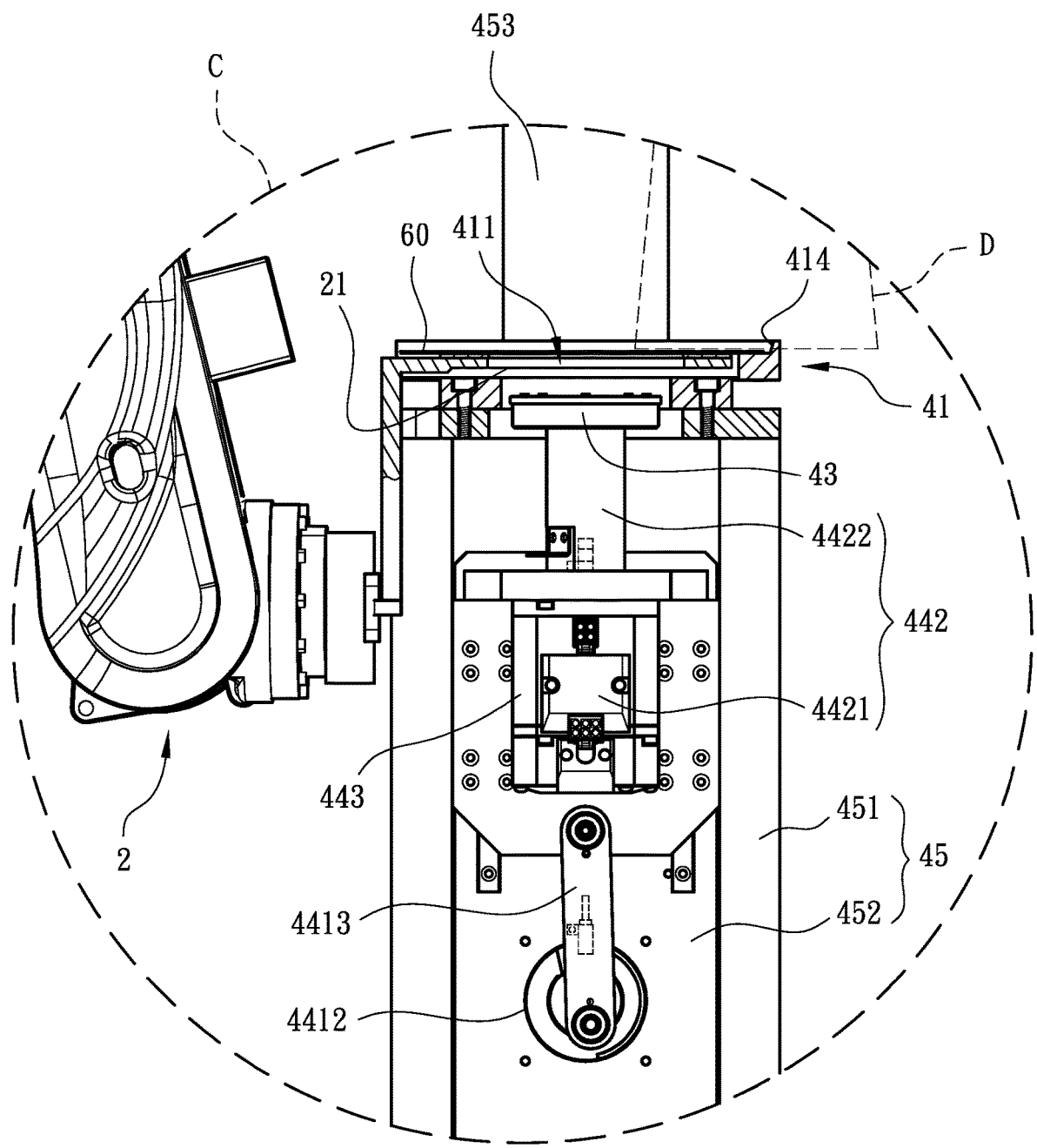
FIG. 19 is an enlarged view of circled area C of FIG. 18.

In step S21 of making the image capturing unit correspond to a portion of the circumference of the wafer, the projection range D of the image capturing unit 42 of the wafer correction mechanism 4 corresponds to the code and the correction mark (notch) position of the wafer 60 to obtain the image data of the code and the correction mark (notch) position of the wafer 60 (as shown in FIGS. 17, 18 and 19).

Figure 20:
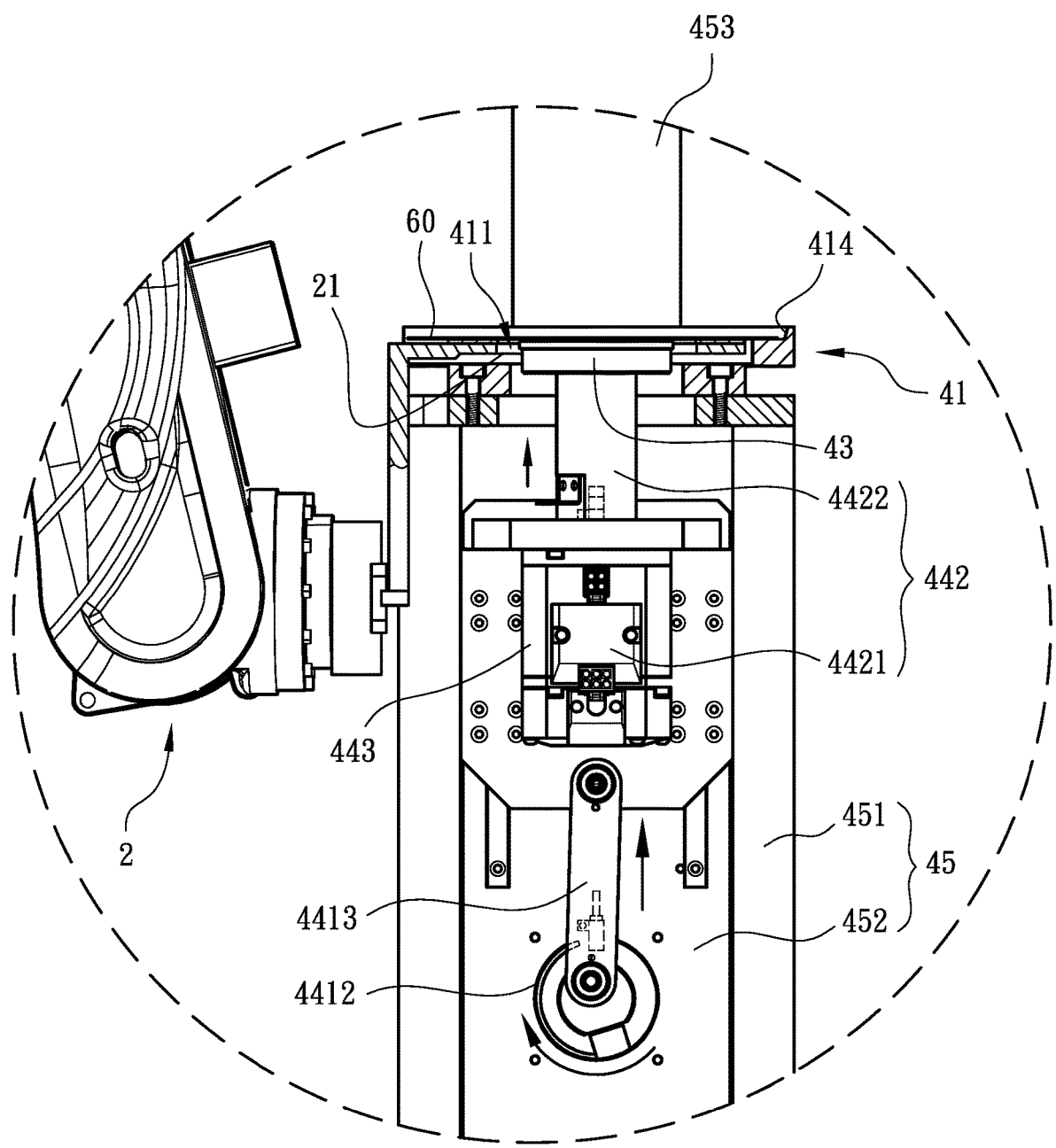
FIG. 20 is an enlarged view showing the operation that the lifting module of the present invention lifts the wafer via the sucker.
Figure 21:
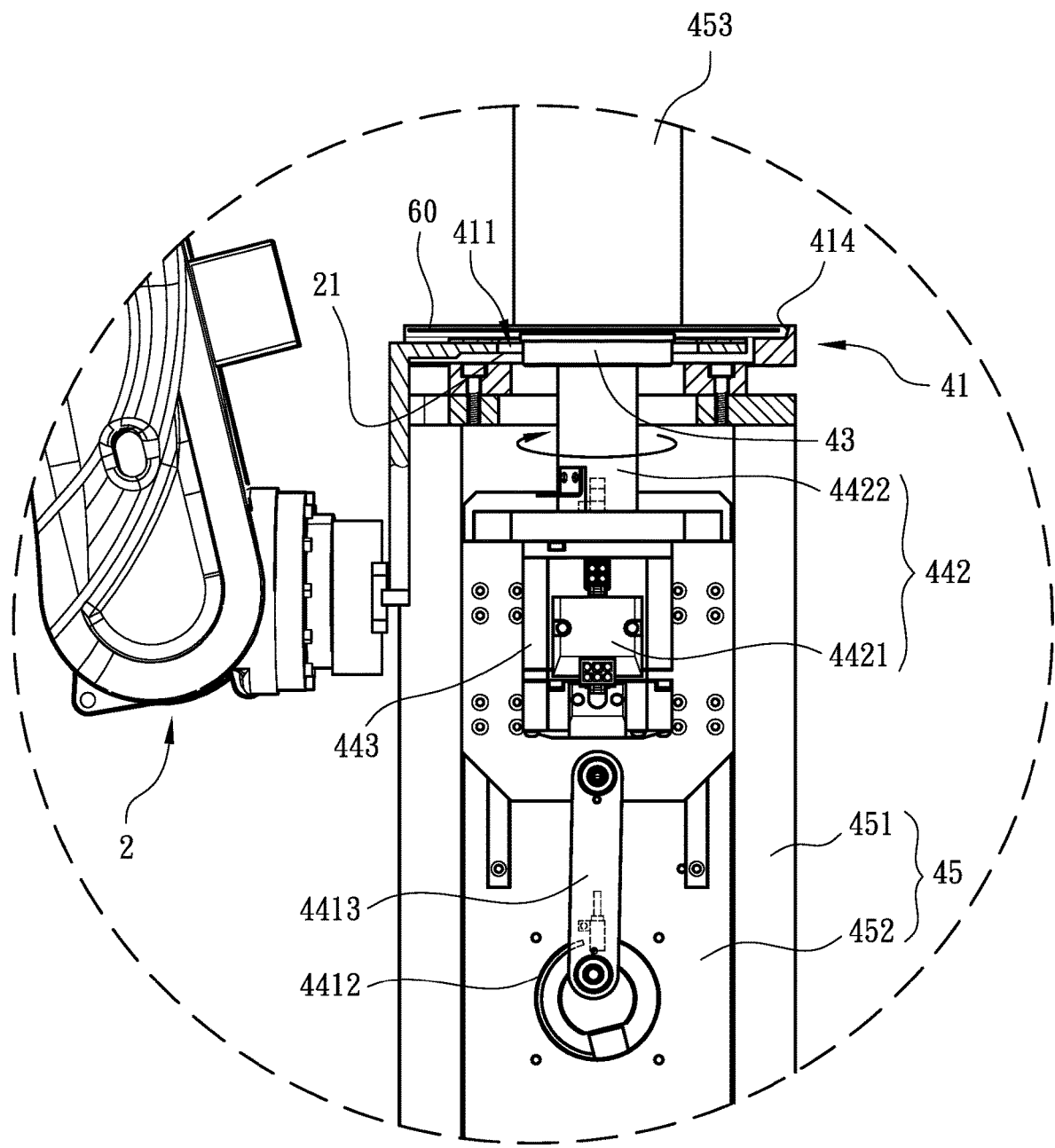
FIG. 21 is an enlarged view showing the operation that the pivotally rotational module of the present invention rotates the wafer via the sucker.

In step S22 of using the rotational drive assembly to drive the wafer to rotate by 360 degrees for the image capturing unit to obtain full image of the circumference of the wafer, the lifting power source 4411 of the lifting module 441 operates to drive the cam 4412 to rotate by 180 degrees, whereby the link 4413 pushes the slide seat 443 to an ascending position to make the sucker 43 into contact with the wafer 60. Then the respective vacuum sucking orifices 431 start to suck air so as to suck the wafer 60 (as shown in FIG. 20). Then the pivotally rotational power source 4421 of the pivotally rotational module 442 drives the pivotally rotational shaft 4422 to drive the sucker 43 and the wafer 60 to rotate each time by one-sixth and totally six times (totally 360 degrees). Accordingly, the image capturing unit 42 can sequentially obtain the image of the full circumference of the wafer 60 (as shown in FIG. 21) so as to check whether the wafer 60 is complete without damage.

In step S23 of using the rotational drive assembly to drive the wafer to rotate to true angular position, according to the correction mark (notch) position of the wafer 60 to be placed into the wafer disc 51, the control module calculates the angle of the wafer 60, which needs to be adjusted. Then the pivotally rotational shaft 4422 drives the sucker 43 and the wafer 60 to rotate by an angle so as to move the correction mark (notch) of the wafer 60 to a true angular position (as shown in FIG. 21, that is, to correct the direction of the notch of the wafer 60). Then the respective vacuum sucking orifices 431 stop sucking air and the lifting power source 4411 of the lifting module 441 via the cam 4412 drives the link 4413 to descend back to the initial position, whereby the sucker 43 separates from the wafer 60 and the wafer 60 falls back onto the rest seat 41.

Figure 22:
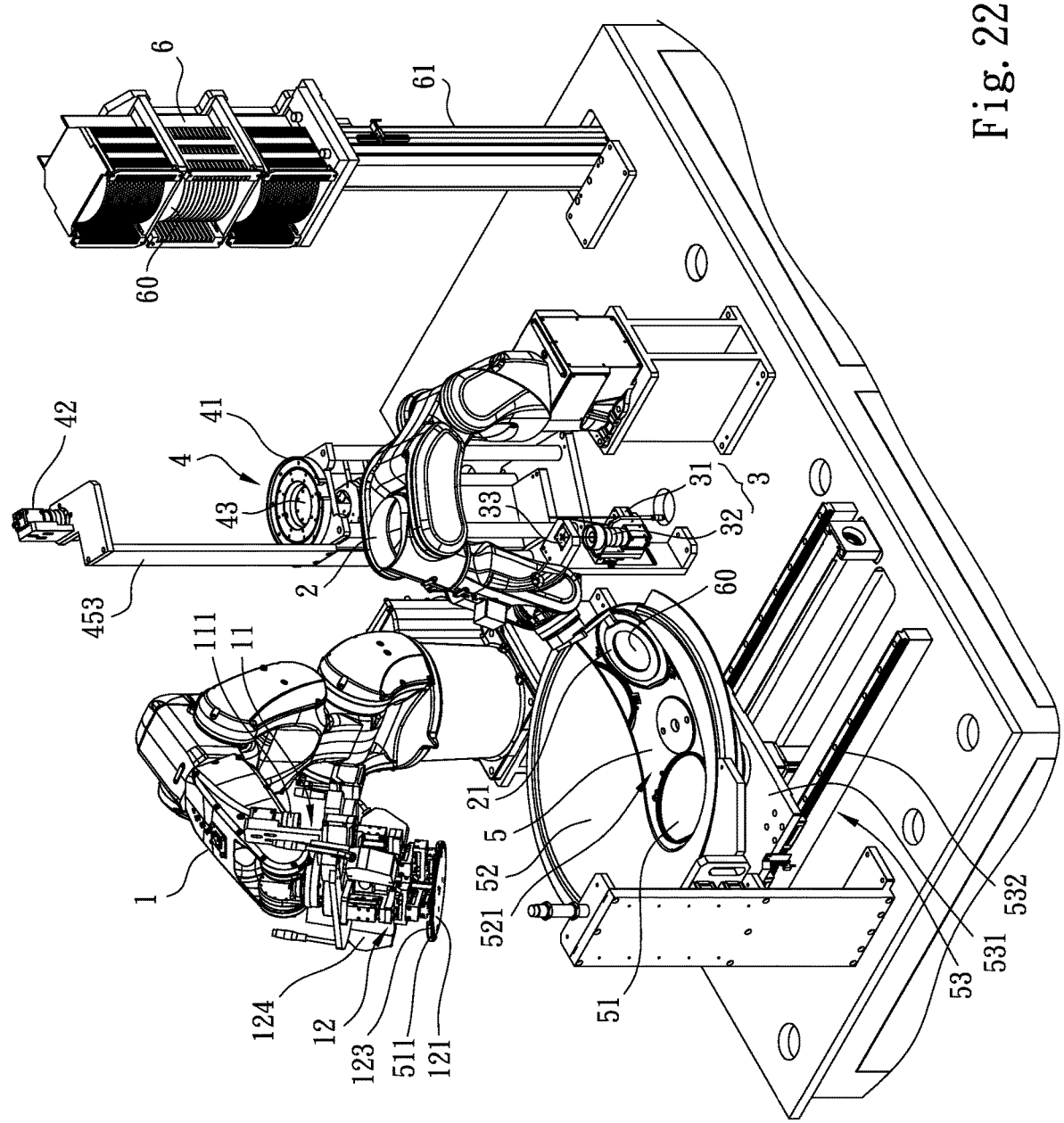
FIG. 22 is a perspective view of the present invention, showing the operation that in practice, the wafer taking/placing mechanism moves the wafer onto the wafer disc.

Please refer to FIGS. 22 to 25. In practice, after the correction procedure of the wafer 60 is completed, the second robotic arm 2 can drive the wafer taking/placing mechanism 21 to take out the wafer 60 with the true direction and angle from the rest seat 41 of the wafer correction mechanism 4 and place the wafer 60 onto the wafer disc 51 of the carrier disc 5 (as shown in FIG. 22).

Figure 23:
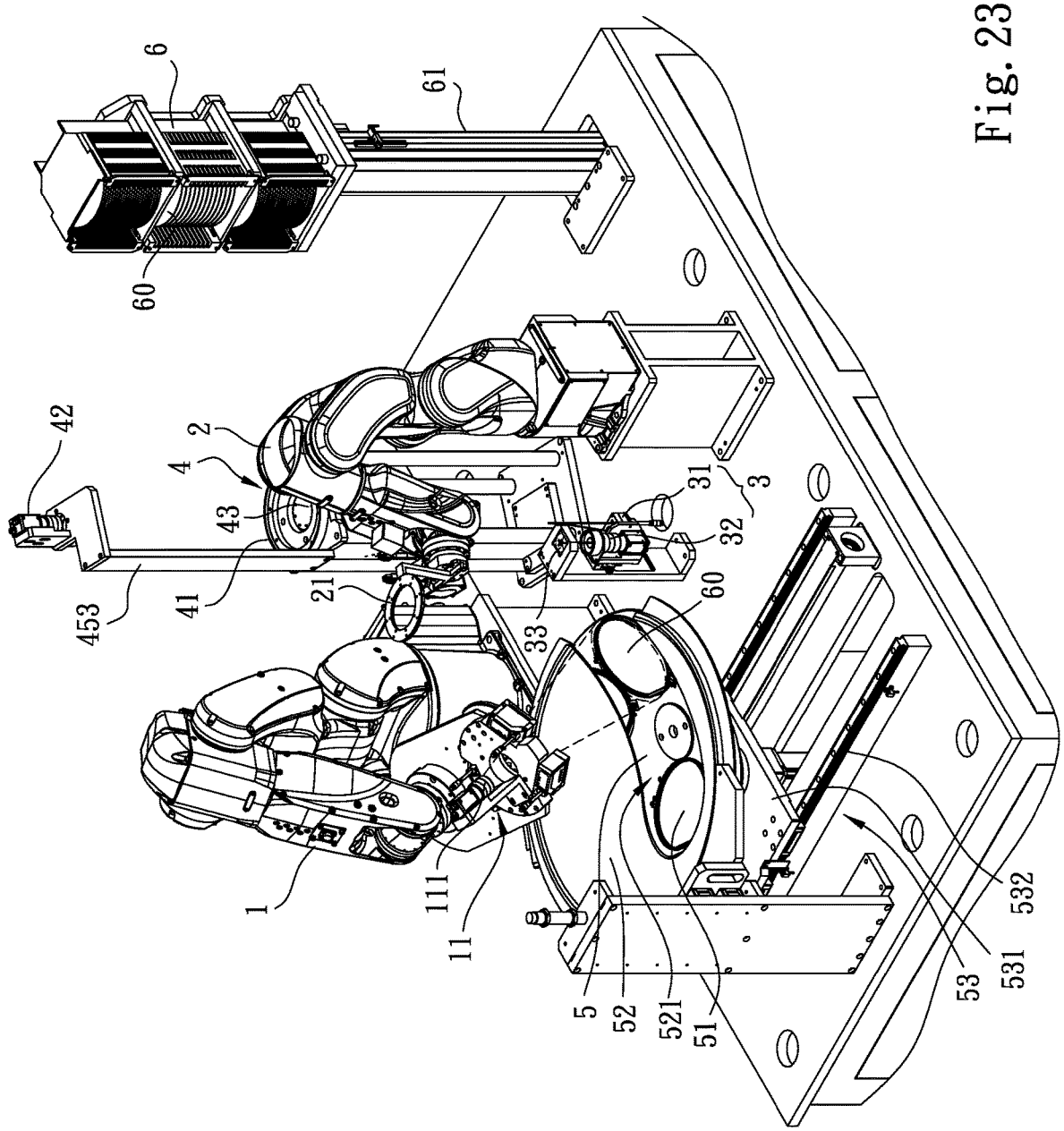
FIG. 23 is a perspective view of the present invention, showing the operation that in practice, the image capturing assembly ensures the state of the wafer on the wafer disc.
Figure 24:
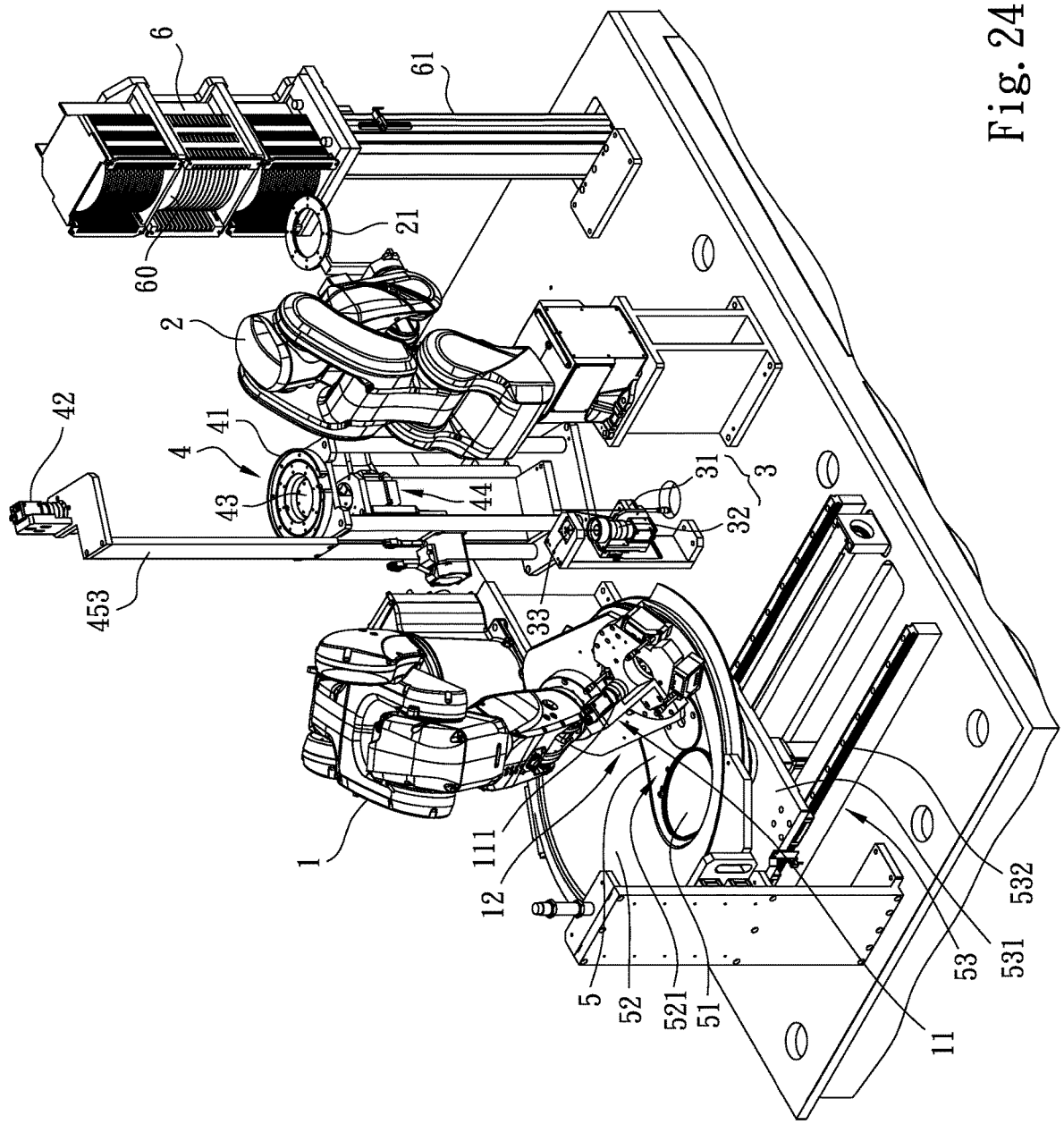
FIG. 24 is a perspective view of the present invention, showing the operation that in practice, the wafer locating member installation/uninstallation mechanism is moved to the upper side of the wafer disc for installing the wafer locating member.
Figure 25:
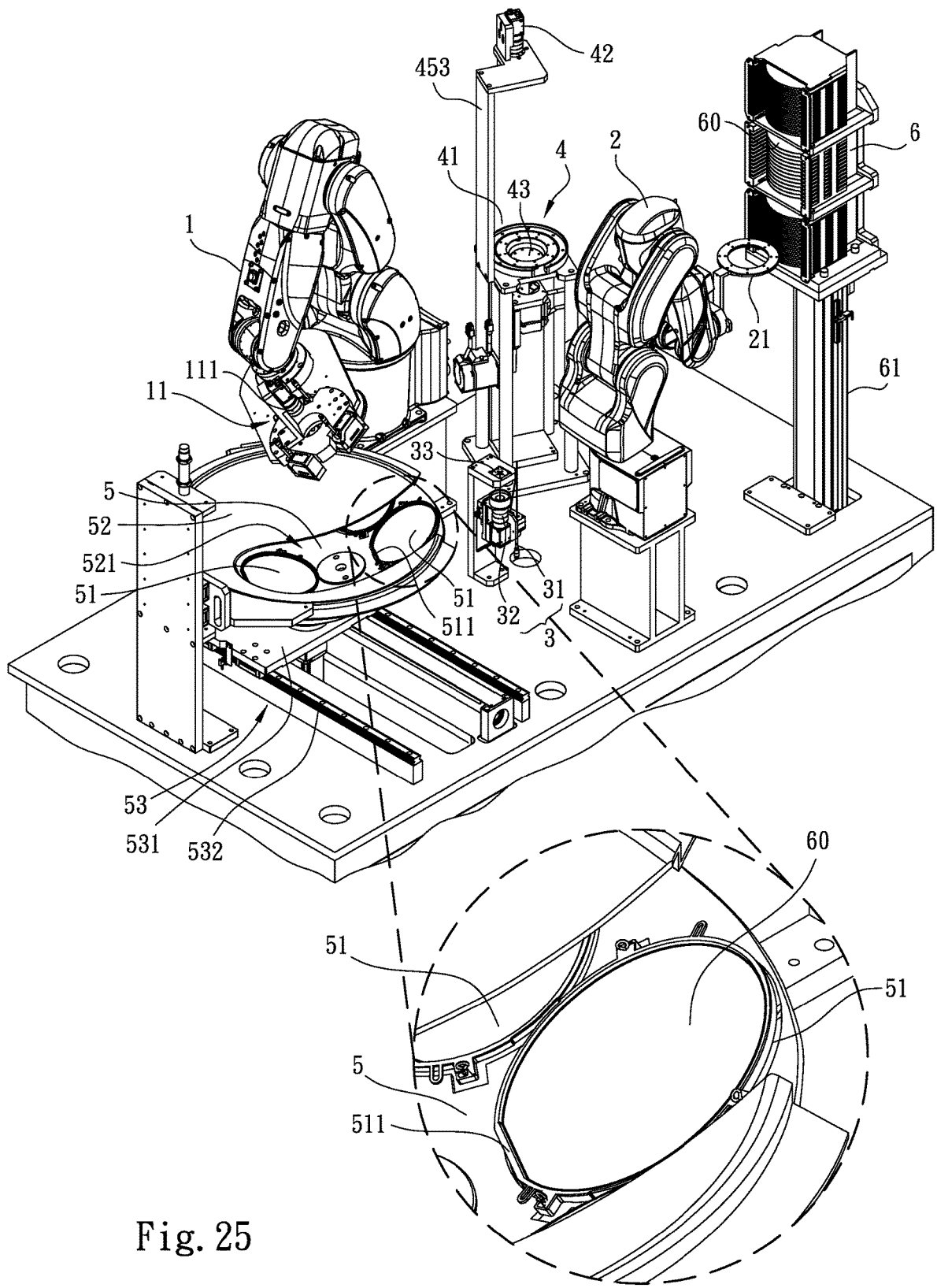
FIG. 25 is a perspective view of the present invention, showing that in practice, the wafer locating member is secured on the wafer disc and the wafer locating member installation/uninstallation mechanism is moved back to the initial position.

Then the first robotic arm 1 drives the image capturing assembly 11 to move to the upper side of the carrier disc 5 (as shown in FIG. 23) to obtain the image of the wafer 60 placed on the carrier disc 5 in the preceding step so as to check whether the wafer 60 is complete and placed in a true position. Then the first robotic arm 1 to drive the wafer locating member installation/uninstallation mechanism 12 to connect the wafer locating member 511 held by the holding components 123 onto the wafer disc 51 (as shown in FIG. 24). The wafer locating member 511 is pressed and mated with the circumference of the wafer 60 to locate the wafer 60 (as shown in FIG. 25).

Thereafter, the pivotally rotational seat 533 drives the carrier disc 5 to rotate and make the wafer disc 51, on which the wafer 60 has been placed, rotate to the lower side of the outer cover 52. At the same time, another wafer disc 51 free from any wafer 60 is moved to a position below the breach 521 of the outer cover 52 and exposed to outer side. Accordingly, the aforesaid correction and wafer placing operations can be sequentially repeated to respectively secure different wafers 60 onto the respective wafer discs 51. Finally, after the wafers 60 are placed on all the wafer discs 51 of the carrier disc 5, the slide seat 531 of the slide mechanism 53 outward slides along the slide guide rails 532 so as to move the carrier disc 5 for the next working procedure.

In conclusion, the correction device for wafers and rotational drive mechanism of the wafers and the correction method thereof of the present invention can truly respectively correct different robotic arms and set up common standard point coordinate and set up relative coordinate of different mechanisms of one single robotic arm. In addition, the present invention has the effect of adjusting the wafer to a true removing angle. The present invention is inventive and advanced.

The above embodiments are only used to illustrate the present invention, not intended to limit the scope thereof. Many modifications of the above embodiments can be made without departing from the spirit of the present invention.

What is claimed is:

1. A correction device for wafers and rotational drive mechanism of the wafers, comprising:
    a first robotic arm connected with and drivable by a control module, an image capturing assembly and a wafer locating member installation/uninstallation mechanism being disposed at a movable end of the first robotic arm, the image capturing assembly including an upper image capturing component, the wafer locating member installation/uninstallation mechanism having a locating face, a locating scale being disposed on the locating face;
    a second robotic arm connected with and drivable by the control module, a wafer taking/placing mechanism being disposed at a movable end of the second robotic arm, an indication scale being disposed on the wafer taking/placing mechanism; and
    a main correction mechanism positioned within a moving range of the first and second robotic arms, the main correction mechanism being connected with and drivable by the control module, the main correction mechanism having a lower image capturing component, a transparent sheet being disposed above the lower image capturing component, a standard scale being disposed on the transparent sheet as a locating reference.

2. The correction device for wafers and rotational drive mechanism of the wafers as claimed in claim 1, wherein a range-finding laser source is disposed beside the lower image capturing component of the main correction mechanism, multiple laser sources being arranged along a circumference of the locating face of the wafer locating member installation/uninstallation mechanism, the multiple laser sources being respectively disposed at least three points beside the locating face.

3. The correction device for wafers and rotational drive mechanism of the wafers as claimed in claim 2, further comprising a wafer correction mechanism, the wafer correction mechanism having a rest seat for placing a wafer thereon, an image capturing unit for capturing images, a sucker for sucking a wafer and a rotational drive assembly, the image capturing unit being disposed above the rest seat, the sucker being disposed under the rest seat, the rotational drive assembly being connected under the sucker for driving the sucker to carry the wafer on the rest seat to ascend/descend and pivotally rotate.

4. The correction device for wafers and rotational drive mechanism of the wafers as claimed in claim 3, wherein the rotational drive assembly has a lifting module and a pivotally rotational module, the lifting module including a lifting power source, a cam drivable by the lifting power source to pivotally rotate and a link, one end of the link being pivotally connected with the cam, the pivotally rotational module having a pivotally rotational power source, the pivotally rotational power source being disposed on a vertically slideable slide seat and connected with the other end of the link, a pivotally rotational shaft being disposed on the pivotally rotational power source and connected with the sucker.

5. The correction device for wafers and rotational drive mechanism of the wafers as claimed in claim 4, wherein a support module is disposed on one side of the rest seat, the support module having multiple support legs positioned under the rest seat to support the rest seat, a lower side support being disposed on one side of the support legs, the rotational drive assembly being securely connected with the lower side support, an upper side support upward extending from another side of the support legs, the image capturing unit being secured to one end of the upper side support distal from the lower side support.

6. The correction device for wafers and rotational drive mechanism of the wafers as claimed in claim 1, further comprising a wafer correction mechanism, the wafer correction mechanism having a rest seat for placing a wafer thereon, an image capturing unit for capturing images, a sucker for sucking a wafer and a rotational drive assembly, the image capturing unit being disposed above the rest seat, the sucker being disposed under the rest seat, the rotational drive assembly being connected under the sucker for driving the sucker to carry the wafer on the rest seat to ascend/descend and pivotally rotate.

7. The correction device for wafers and rotational drive mechanism of the wafers as claimed in claim 6, wherein the rotational drive assembly has a lifting module and a pivotally rotational module, the lifting module including a lifting power source, a cam drivable by the lifting power source to pivotally rotate and a link, one end of the link being pivotally connected with the cam, the pivotally rotational module having a pivotally rotational power source, the pivotally rotational power source being disposed on a vertically slideable slide seat and connected with the other end of the link, a pivotally rotational shaft being disposed on the pivotally rotational power source and connected with the sucker.

8. The correction device for wafers and rotational drive mechanism of the wafers as claimed in claim 7, wherein a support module is disposed on one side of the rest seat, the support module having multiple support legs positioned under the rest seat to support the rest seat, a lower side support being disposed on one side of the support legs, the rotational drive assembly being securely connected with the lower side support, an upper side support upward extending from another side of the support legs, the image capturing unit being secured to one end of the upper side support distal from the lower side support.

9. The correction device for wafers and rotational drive mechanism of the wafers as claimed in claim 6, wherein a center of the rest seat is formed with a through hole, the sucker being disposed in a position corresponding to the through hole, a flange being annularly disposed along the circumference of the rest seat.

10. The correction device for wafers and rotational drive mechanism of the wafers as claimed in claim 9, wherein an inward extending guide slope protrudes from an outer circumference of the flange.

11. The correction device for wafers and rotational drive mechanism of the wafers as claimed in claim 10, wherein a recessed section is formed on a portion of the flange of the rest seat.

* * * * *